(12) United States Patent
Tsuda et al.

(10) Patent No.: US 10,096,972 B1
(45) Date of Patent: Oct. 9, 2018

(54) CURRENT CONTROL DEVICE AND CURRENT CONTROL METHOD

(71) Applicant: Mitsubishi Electric Corporation, Chiyoda-ku (JP)

(72) Inventors: Shingo Tsuda, Tokyo (JP); Takeshi Morimoto, Tokyo (JP); Taichiro Tamida, Tokyo (JP); Takashi Hashimoto, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/759,841

(22) PCT Filed: Dec. 1, 2015

(86) PCT No.: PCT/JP2015/083766
§ 371 (c)(1),
(2) Date: Mar. 14, 2018

(87) PCT Pub. No.: WO2017/094120
PCT Pub. Date: Jun. 8, 2017

(51) Int. Cl.
| H01S 5/00 | (2006.01) |
|---|---|
| H01S 5/042 | (2006.01) |
| H01S 5/40 | (2006.01) |
| H03K 7/08 | (2006.01) |
| H01S 5/0625 | (2006.01) |
| H01S 5/062 | (2006.01) |

(52) U.S. Cl.
CPC ........ *H01S 5/0427* (2013.01); *H01S 5/06216* (2013.01); *H01S 5/06253* (2013.01); *H01S 5/4025* (2013.01); *H03K 7/08* (2013.01)

(58) Field of Classification Search
CPC .. H01S 5/0427; H01S 5/0428; H01S 5/06216; H01S 5/06253; H01S 5/4025; H03K 7/08
See application file for complete search history.

(56) References Cited

U.S. PATENT DOCUMENTS

| 5,736,881 A | 4/1998 | Ortiz |
|---|---|---|
| 2012/0206427 A1 | 8/2012 | Yamamuro et al. |

FOREIGN PATENT DOCUMENTS

| JP | 05-218542 A | 8/1993 |
|---|---|---|
| JP | 08-228026 A | 9/1996 |
| JP | 2009-238633 A | 10/2009 |
| JP | 2010-015883 A | 1/2010 |
| WO | 2011/052418 A1 | 5/2011 |

OTHER PUBLICATIONS

International Search Report dated Feb. 16, 2016 in PCT/JP2015/083766, filed on Dec. 1, 2015.

*Primary Examiner* — Armando Rodriguez
(74) *Attorney, Agent, or Firm* — Oblon, McClelland, Maier & Neustadt, L.L.P.

(57) ABSTRACT

A current control device for controlling, on the basis of a current command value input from an external device, a light-emitting unit current flowing from a power supply device to a light-emitting unit that includes one or a plurality of laser diodes, includes: a switching element coupled in parallel to the light-emitting unit; and a pulse-width-modulation control circuit unit to provide pulse width modulation control of the switching element in a case in which an output current output from the power supply device is greater than a present current command value or a next current command value upon a start of supply of, upon a termination of supply of, or during supply of, the light-emitting unit current.

6 Claims, 20 Drawing Sheets

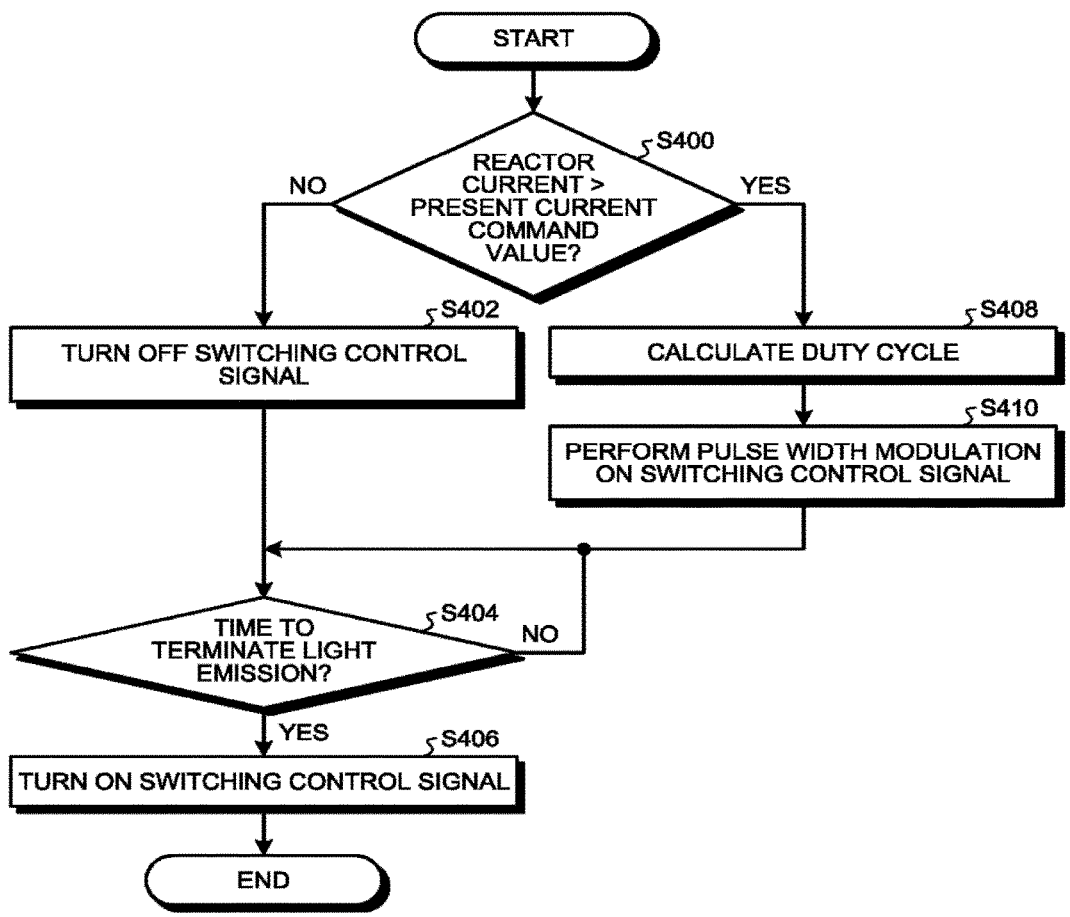

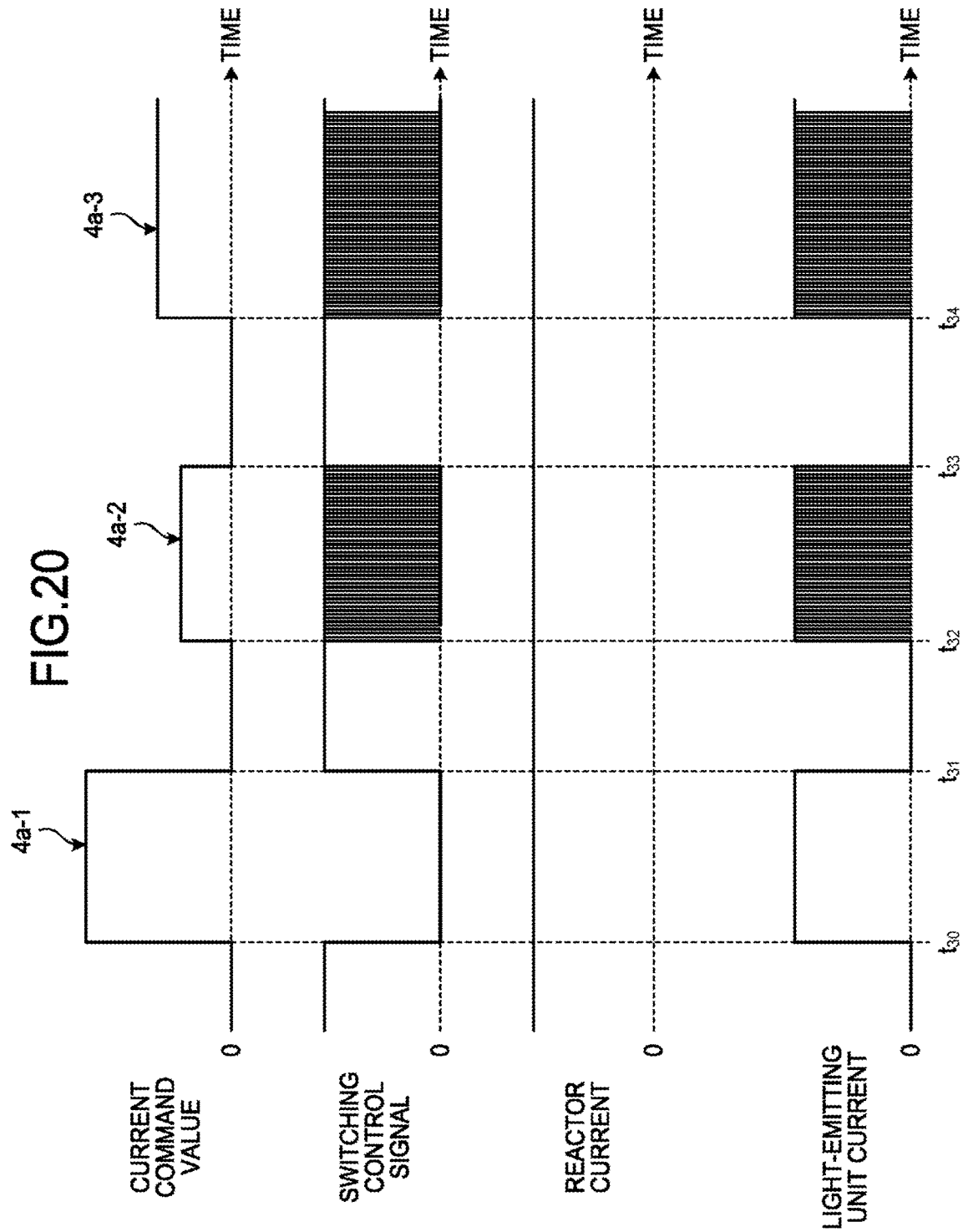

US 10,096,972 B1

CURRENT CONTROL DEVICE AND CURRENT CONTROL METHOD

FIELD

The present invention relates to a current control device and a current control method for controlling current flowing into a light-emitting unit that includes one or multiple laser diodes (LDs).

BACKGROUND

A $CO_2$ laser or an yttrium-aluminum-garnet (YAG) laser has been mainly used in the field of machining exemplified by welding, cutting, or marking of metal. However, in recent years, a semiconductor laser excited solid-state laser or a semiconductor laser excited fiber laser produces an increasingly higher output power. Thus, in the field of machining described above, the use of semiconductor laser excited solid-state lasers and semiconductor laser excited fiber lasers are increasing in place of $CO_2$ lasers and YAG lasers.

A laser diode is used for a semiconductor laser excited laser oscillation source. To produce a high output power, a laser machine is typically configured such that multiple laser diodes are coupled together in series, in parallel, or in series-parallel to form a laser diode array and thus to cause all the multiple laser diodes to emit light simultaneously. Such a laser diode array requires a large drive current.

In addition, a laser diode is a current-driven element. Therefore, as the power supply device for supplying electrical power to the laser diodes, a high-efficiency, constant-current power supply device is utilized that uses a technique of switched-mode power supply and can supply, at a constant level, a drive current needed for the laser diodes to generate laser oscillation at a desired output power.

It is generally preferable that when a load is a current-driven element, a constant-current power supply device includes, on an output line, an element for storing electromagnetic energy to reduce fluctuations in the current supplied to the load. A reactor is used as such an element for storing electromagnetic energy.

However, since a constant-current power supply device includes a reactor that stores electromagnetic energy, the output current changes more slowly than the current command value changes. In particular, when the current command value is changed from a higher value to a lower value, the constant-current power supply device reduces the output current slowly due to the electromagnetic energy stored in the reactor.

Thus, when the current command value is changed from a higher value to a lower value, a drive current greater than the current command value flows into the laser diodes, thereby preventing the constant-current power supply device from performing suitable machining.

Patent Literature 1 describes a lighting circuit that includes a drive circuit that performs DC/DC conversion on a direct current (DC) supply voltage to obtain an output voltage and supplies an output current that depends on a lighting control signal to one or multiple light-emitting elements; and a forced attenuation circuit connected in parallel to the one or multiple light-emitting elements to forcibly attenuate the output current from the drive circuit in synchronization with the lighting control signal while the one or multiple light-emitting elements are unlit (paragraph [0009]).

Patent Literature 2 describes a light emitting diode (LED) lighting device that includes an LED circuit that includes one or more LEDs; a switched-mode power supply for supplying power to the LED circuit; and a lighting control circuit that drives the switched-mode power supply at a predetermined dimming duty cycle to control lighting of the one or more LEDs, wherein when the lighting control circuit does not drive the switched-mode power supply at the dimming duty cycle, the lighting control circuit drives the switched-mode power supply at a pre-duty cycle that is predetermined (paragraph [0008]).

CITATION LIST

Patent Literature

Patent Literature 1: Japanese Patent Application Laid-open No. 2010-15883
Patent Literature 2: Japanese Patent Application Laid-open No. 2009-238633

SUMMARY

Technical Problem

The lighting circuit described in Patent Literature 1 allows the drive current of the light-emitting elements to be immediately attenuated upon changing the light-emitting elements from a light emission state to a non-light emission state by means of the lighting control signal, thereby enabling prompt relighting (paragraph "0010"). However, because the lighting circuit described in Patent Literature 1 needs a forced attenuation circuit, this results in an increase in the number of components, in the substrate area, and in the cost.

The LED lighting device described in Patent Literature 2 additionally provides control, aiming at improvement in the appearance, of increasing in advance the voltage generated by the switched-mode power supply to a voltage that would not cause degradation in the appearance. This enables the LED lighting device described in Patent Literature 2 to reduce the time required for the switched-mode power supply to generate the voltage that allows current corresponding to the dimming duty cycle to be supplied to the LEDs even when the dimming duty cycle is low. Thus, the time required for the LEDs to turn on can be reduced, and the appearance can also be improved (paragraph [0009]). However, the LED lighting device described in Patent Literature 2 cannot control the phenomenon in which a drive current greater than the current command value flows into the laser diodes when the current command value is changed from a higher value to a lower value.

The present invention has been made in view of the foregoing, and it is an object of the present invention to provide a current control device that can provide suitable light emission even when the current command value is changed from a higher value to a lower value.

Solution to Problem

In order to solve the above-described problem and achieve the object, an aspect of the present invention is a current control device for controlling, on a basis of a current command value input from an external device, a light-emitting unit current flowing from a power supply device to a light-emitting unit that includes one or a plurality of laser diodes, including: a switching element coupled in parallel to the light-emitting unit; and a pulse-width-modulation control circuit unit to provide pulse width modulation control of the switching element in a case in which an output current output from the power supply device is greater than a present current command value or a next current command value upon a start of supply of, upon a termination of supply of, or during supply of, the light-emitting unit current.

Advantageous Effects of Invention

A current control device according to the present invention provides an effect in that suitable light emission is performed even when the current command value is changed from a higher value to a lower value.

BRIEF DESCRIPTION OF DRAWINGS

FIG. 19 is a flowchart illustrating an operation of a current control device according to a fifth embodiment.

FIG. 20 is a waveform chart for explaining the operation of the current control device according to the fifth embodiment.

DESCRIPTION OF EMBODIMENTS

A current control device and a current control method according to embodiments of the present invention will be described in detail below on the basis of the drawings. Note that these embodiments are not intended to limit the present invention.

First Embodiment

Figure 1:
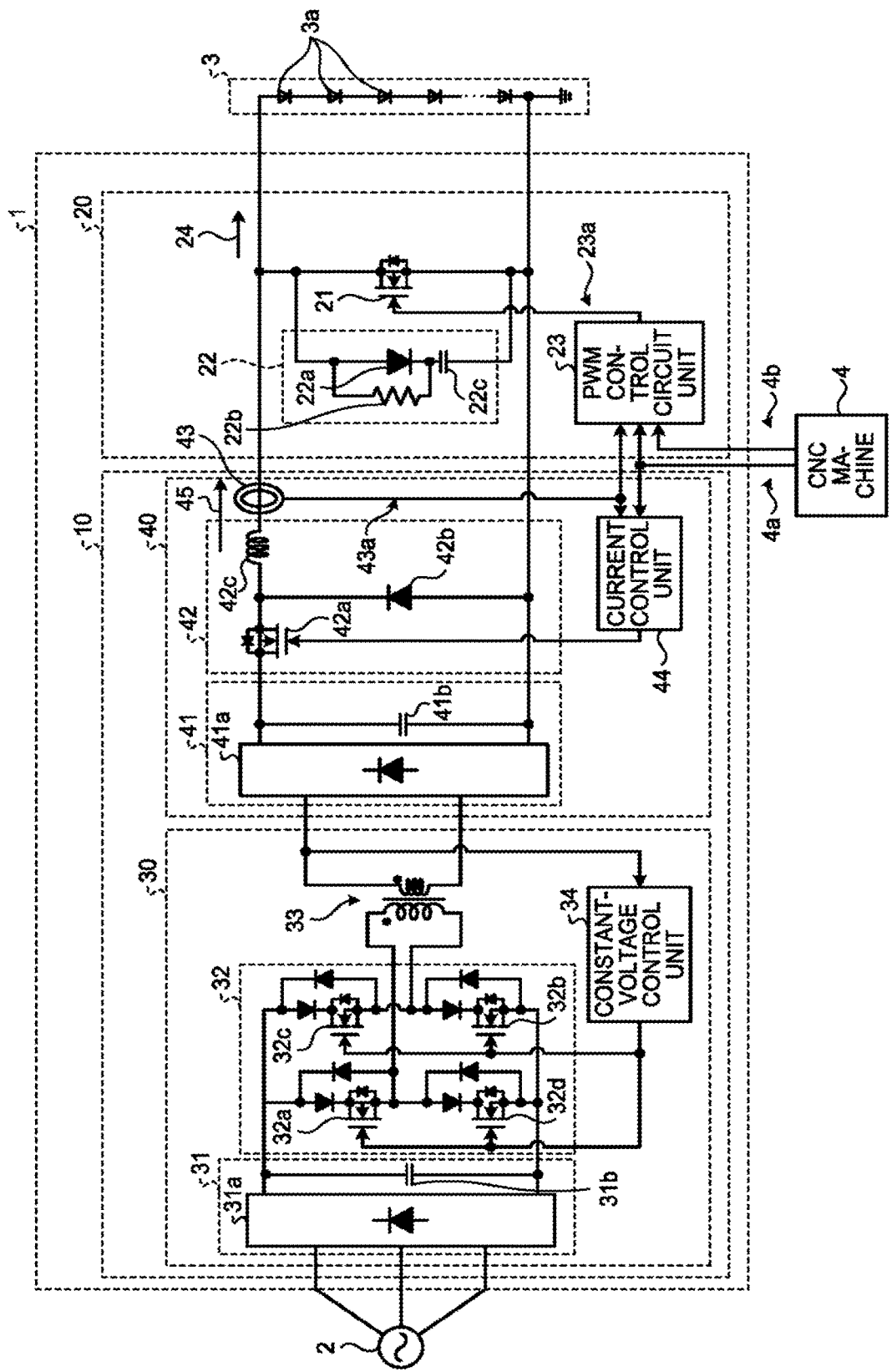
FIG. 1 is a diagram illustrating a configuration of a laser-diode power supply apparatus that includes a current control device according to a first embodiment.

FIG. 1 is a diagram illustrating a configuration of a laser-diode power supply apparatus that includes a current control device according to a first embodiment.

A laser-diode power supply apparatus 1 is supplied with three-phase alternating current (AC) power from a system power supply 2, and outputs, to a light-emitting unit 3, current corresponding to a current command value 4a input from an external computer numerical control (CNC) machine 4.

The light-emitting unit 3 includes one or multiple laser diodes (LDs) 3a. When the light-emitting unit 3 includes multiple laser diodes 3a, the multiple laser diodes 3a are coupled together in series, in parallel, or in series-parallel.

The laser diodes 3a are each a current-driven element, and emit light having an intensity corresponding to the magnitude of current. Thus, the laser-diode power supply apparatus 1 can control the intensity of light of the light-emitting unit 3 by controlling current supplied to the light-emitting unit 3.

The laser-diode power supply apparatus 1 includes a power supply device 10 that outputs current corresponding to the current command value 4a input from the CNC machine 4; and a current control device 20 that controls current supplied to the light-emitting unit 3 on the basis of the current command value 4a.

The power supply device 10 includes a constant-voltage output unit 30 that is supplied with three-phase AC power from the system power supply 2 and outputs a constant AC voltage; and a current output unit 40 that is supplied with a constant AC voltage from the constant-voltage output unit 30 and outputs current corresponding to the current command value 4a input from the CNC machine 4.

The constant-voltage output unit 30 includes a DC conversion unit 31 that converts a three-phase AC voltage applied by the system power supply 2 into a DC voltage; an inverter unit 32 that is supplied with a DC voltage from the DC conversion unit 31 and outputs an AC voltage; a transformer 33 that transforms an AC voltage applied to the primary winding of the transformer 33 by the inverter unit 32 and outputs the converted AC voltage from the secondary winding of the transformer 33; and a constant-voltage control unit 34 that controls the inverter unit 32 such that an AC voltage output from the transformer 33 becomes a constant AC voltage.

The DC conversion unit 31 includes a rectifier unit 31a that rectifies a three-phase AC voltage applied by the system power supply 2 into a DC voltage; and a capacitor 31b that smooths a DC voltage output from the rectifier unit 31a. An example of the rectifier unit 31a is a diode bridge.

The inverter unit 32 includes switching elements 32a, 32b, 32c, and 32d. When the switching elements 32a and 32b are in an ON state, a voltage is applied across the path extending from the higher-potential output line of the rectifier unit 31a through, sequentially, the switching element 32a, the primary winding of the transformer 33, and the switching element 32b, to the lower-potential output line of the rectifier unit 31a. When the switching elements 32c and 32d are in an ON state, a voltage is applied across the path extending from the higher-potential output line of the rectifier unit 31a through, sequentially, the switching element 32c, the primary winding of the transformer 33, and the switching element 32d, to the lower-potential output line of the rectifier unit 31a.

The current output unit 40 includes a DC conversion unit 41 that converts a constant AC voltage applied by the constant-voltage output unit 30 into a DC voltage; a step-down chopper unit 42 that steps down a DC voltage applied by the DC conversion unit 41; a current detection unit 43 that detects an output current 45 output from the step-down chopper unit 42 and outputs a detected current value 43a; and a current control unit 44 that receives an input of the detected current value 43a and controls the step-down chopper unit 42 such that the output current 45 becomes current corresponding to the current command value 4a.

The DC conversion unit 41 includes a rectifier unit 41a that rectifies a constant AC voltage applied by the constant-voltage output unit 30 into a DC voltage; and a capacitor 41b that smooths a DC voltage output from the rectifier unit 41a. An example of the rectifier unit 41a is a diode bridge.

The step-down chopper unit 42 includes a switching element 42a having one end connected to the higher-potential output line of the DC conversion unit 41; a diode 42b having an anode connected to the lower-potential output line of the DC conversion unit 41 and having a cathode connected to the other end of the switching element 42a; and a reactor 42c having one end connected to the other end of the switching element 42a and to the cathode of the diode 42b. The other end of the reactor 42c serves as a higher-potential output line of the step-down chopper unit 42.

The current control unit 44 controls the switching element 42a with pulse width modulation (PWM) such that the detected current value 43a becomes the current command value 4a.

In the first embodiment, the output current 45 of the power supply device 10 may also be referred to as the reactor current 45.

It is generally preferable that when the load is a current-driven element, the power supply device includes, on the output line, an element for storing electromagnetic energy to reduce fluctuations of the current supplied to the load. When the load is a current-driven element, a reactor is typically used as an element for storing electromagnetic energy.

In the first embodiment, the reactor 42c functions to step down the voltage in the step-down chopper unit 42 and also functions to store electromagnetic energy to reduce fluctuations of current 24 supplied to the light-emitting unit 3.

The higher-potential output line of the power supply device 10 is connected to the end on the anode side of the light-emitting unit 3, while the lower-potential output line of the power supply device 10 is connected to the end on the cathode side of the light-emitting unit 3. This configuration allows the current 24 to be supplied from the power supply device 10 to the light-emitting unit 3.

In the first embodiment, the current 24 flowing to the light-emitting unit 3 may also be referred to as light-emitting unit current 24.

As described above, the current output unit 40 provides control such that the reactor current 45 becomes current corresponding to the current command value 4a. However, because the current output unit 40 stores electromagnetic energy in the reactor 42c, the reactor current 45 changes more slowly than the current command value 4a changes. In particular, when the current command value 4a is changed from a higher value to a lower value, the current output unit 40 reduces the reactor current 45 slowly due to the electromagnetic energy stored in the reactor 42c and absence of an element to consume the electromagnetic energy stored in the reactor 42c. This may cause current greater than the current command value 4a to flow to the light-emitting unit 3 when the current command value 4a is changed from a higher value to a lower value, thereby possibly hindering the laser-diode power supply apparatus 1 from providing suitable machining.

Thus, in the first embodiment, the current control device 20 provides control such that the light-emitting unit current 24 becomes current corresponding to the current command value 4a.

This operation enables the current control device 20 to change the light-emitting unit current 24 rapidly when the current command value 4a is changed from a higher value to a lower value. Thus, the current control device 20 can suitably control light emission of the light-emitting unit 3 even when the current command value 4a is changed from a higher value to a lower value. Accordingly, the current control device 20 enables suitable machining of a workpiece to be provided.

The current control device 20 includes a switching element 21 coupled in parallel to the light-emitting unit 3; a snubber circuit 22 that reduces a surge voltage occurring across both ends of the switching element 21 when the switching element 21 transitions from an ON state to an OFF state; and a PWM control circuit unit 23 that provides pulse width modulation control of the switching element 21 to provide control such that the light-emitting unit current 24 becomes current corresponding to the current command value 4a.

The snubber circuit 22 includes a diode 22a having an anode connected to the terminal at a higher potential of the switching element 21; a resistor 22b coupled in parallel to the diode 22a; and a capacitor 22c coupled to the cathode of the diode 22a and to the terminal at a lower potential of the switching element 21.

The ON resistance of the switching element 21 is much lower than the resistance of the light-emitting unit 3; therefore, when the switching element 21 is in an ON state, the reactor current 45 output from the power supply device 10 flows to the switching element 21 rather than to the light-emitting unit 3. When the switching element 21 is in an OFF state, the reactor current 45 output from the power supply device 10 flows to the light-emitting unit 3 rather than to the switching element 21.

Thus, the PWM control circuit unit 23 can perform pulse width modulation on the light-emitting unit current 24 by providing pulse width modulation control of the switching element 21.

Note that in a case in which the rated current of the light-emitting unit 3, i.e., the reactor current 45 output from the power supply device 10, is so low that the surge voltage does not exceed the breakdown voltage of the switching element 21, the snubber circuit 22 may be omitted.

Figure 2:
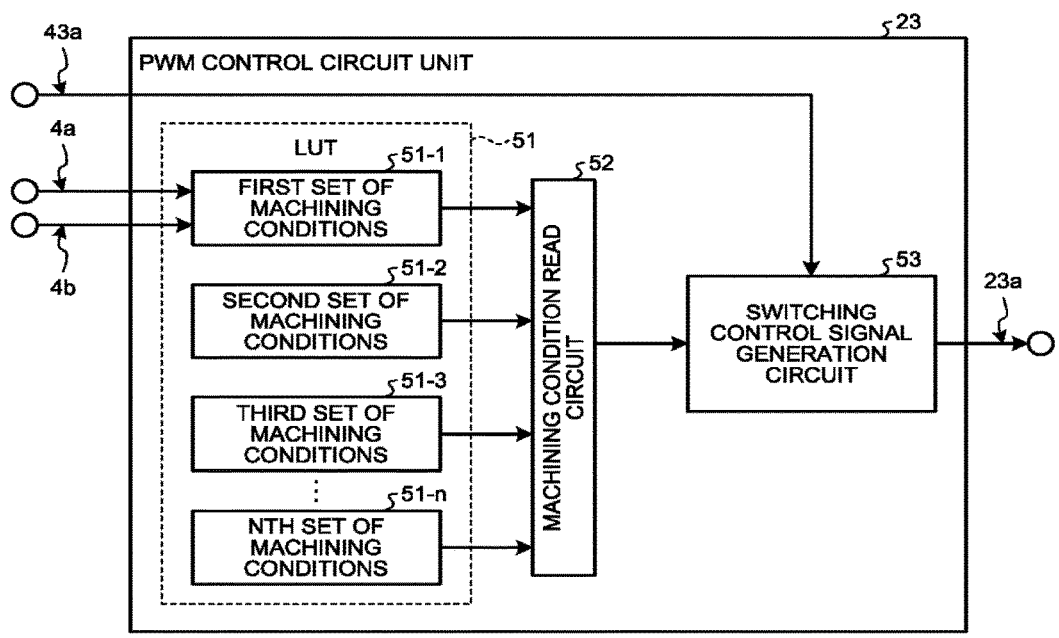
FIG. 2 is a diagram illustrating a configuration of a PWM control circuit unit of the current control device according to the first embodiment.

FIG. 2 is a diagram illustrating a configuration of the PWM control circuit unit of the current control device according to the first embodiment. The PWM control circuit unit 23 includes a look-up table (LUT) 51 that stores machining conditions including the current command value 4a and a light emission timing signal 4b indicating a light emission start timing and a light emission end timing, and the current command value 4a and the light emission timing signal 4b are input from the CNC machine 4.

The look-up table 51 includes multiple machining condition storage areas 51-1 to 51-n (where n is an integer greater than 1) that each store a set of machining conditions. The machining conditions from the CNC machine 4 are prefetched and stored in the machining condition storage areas 51-1 to 51-n.

The PWM control circuit unit 23 includes a machining condition read circuit 52 that reads a machining condition from the look-up table 51; and a switching control signal generation circuit 53 that outputs a switching control signal 23a to the switching element 21 on the basis of the machining condition read by the machining condition read circuit 52 and of the detected current value 43a.

An operation of the current control device 20 will now be described.

Figure 3:
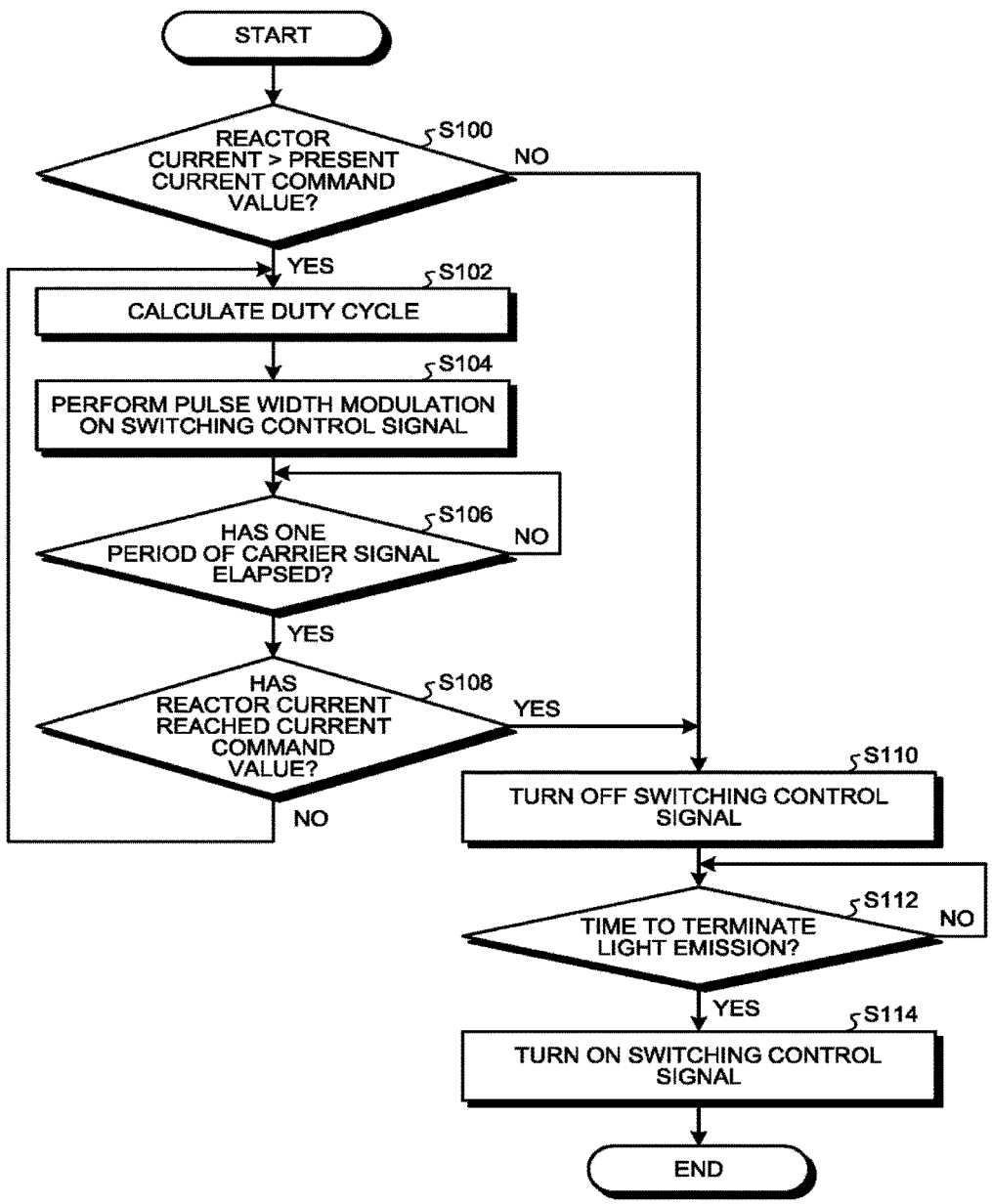
FIG. 3 is a flowchart illustrating an operation of the current control device according to the first embodiment.
Figure 4:
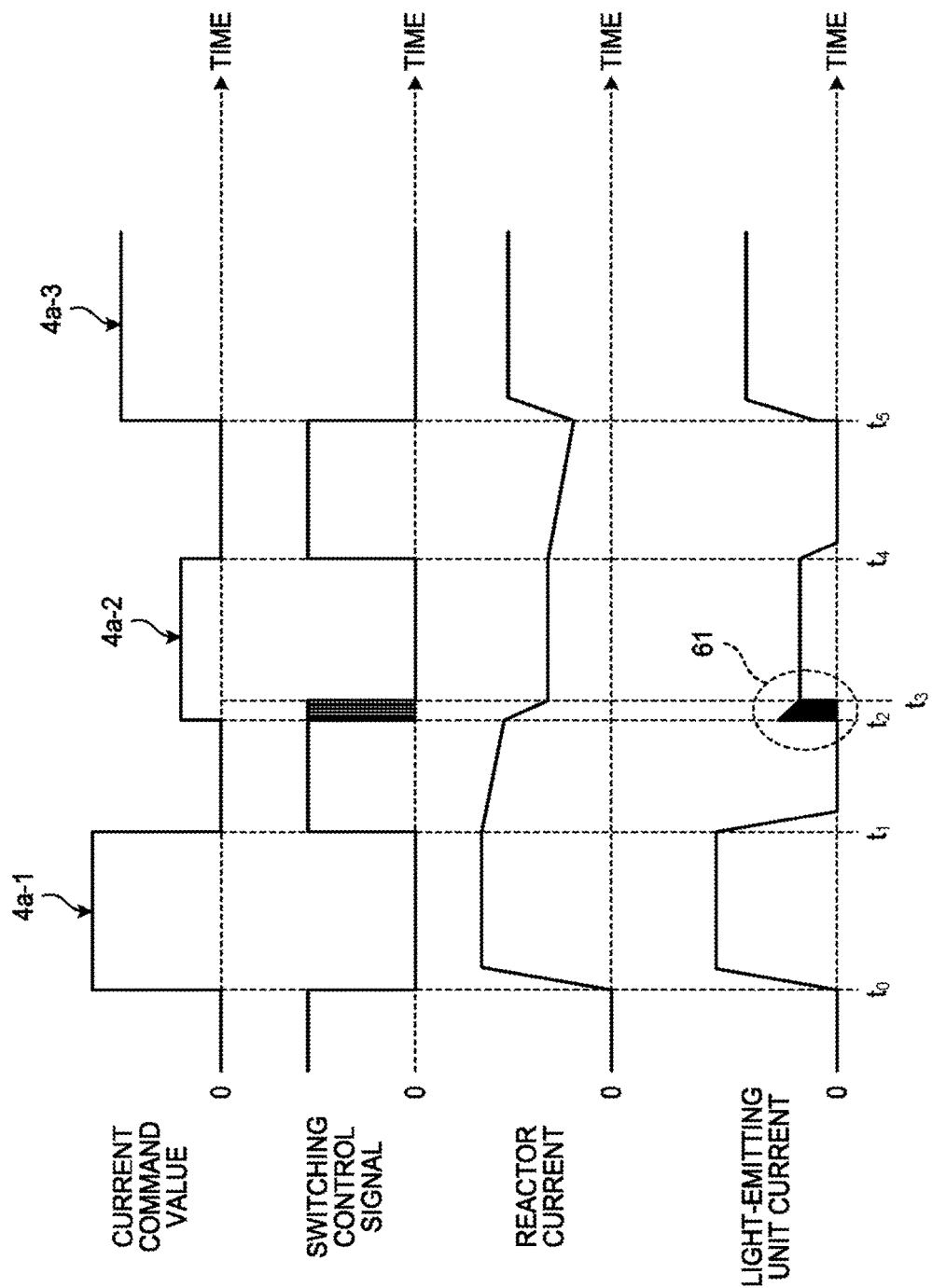
FIG. 4 is a waveform chart for explaining the operation of the current control device according to the first embodiment.

FIG. 3 is a flowchart illustrating an operation of the current control device according to the first embodiment. FIG. 4 is a waveform chart for explaining the operation of the current control device according to the first embodiment. FIG. 4 illustrates a waveform of the current command value 4a, a waveform of the switching control signal 23a, a waveform of the reactor current 45, and a waveform of the light-emitting unit current 24.

In the first embodiment, the machining condition storage area 51-1 stores a first set of machining conditions that include a first current command value 4a-1 and a first light emission timing signal; the machining condition storage area 51-2 stores a second set of machining conditions that include a second current command value 4a-2 and a second light emission timing signal; and the machining condition storage area 51-3 stores a third set of machining conditions that include a third current command value 4a-3 and a third light emission timing signal. It is assumed here that the first current command value 4a-1 is greater than the second current command value 4a-2 and the second current command value 4a-2 is less than the third current command value 4a-3.

The switching control signal generation circuit 53 starts the process illustrated in FIG. 3 at timing to, which is the time to start light emission indicated in the first light emission timing signal.

In addition, at timing to, the power supply device 10 starts outputting the reactor current 45 based on the first current command value 4a-1.

Referring to FIG. 3, at step S100, the switching control signal generation circuit 53 determines whether the reactor current 45 is greater than the present current command value, i.e., the first current command value 4a-1.

Timing to is the time to start first light emission and is the time when the level of the reactor current 45 starts to rise. Thus, the switching control signal generation circuit 53 determines that the reactor current 45 is not greater than the first current command value 4a-1 (No) at step S100 and allows the process to proceed to step S110.

At step S110, the switching control signal generation circuit 53 turns off the switching control signal 23a. This operation causes the switching element 21 to transition to an OFF state and thereby causes the reactor current 45 to flow to the light-emitting unit 3 rather than to the switching element 21.

At step S112, the switching control signal generation circuit 53 waits until timing $t_1$ (No), which is the time to terminate light emission indicated in the first light emission timing signal, and at timing $t_1$ (Yes), allows the process to proceed to step S114.

At step S114, the switching control signal generation circuit 53 turns on the switching control signal 23a and then terminates the process. This operation causes the switching element 21 to transition to an ON state and thereby causes the reactor current 45 to flow to the switching element 21 rather than to the light-emitting unit 3.

In addition, at timing t1, the power supply device 10 provides control such that the reactor current 45 becomes current corresponding to the second current command value 4a-2. However, as described above, the power supply device 10 has stored electromagnetic energy in the reactor 42c and besides, the power supply device 10 includes no element to consume the electromagnetic energy stored in the reactor 42c; therefore, when the current command value is changed to the second current command value 4a-2, which is less than the first current command value 4a-1, the reactor current 45 is reduced slowly.

During a time period from timing $t_1$ to timing $t_2$ to start light emission indicated in the second light emission timing signal, the reactor current 45 gradually decreases due to the circuit losses in the switching element 21, in the snubber circuit 22, and in the diode 42b.

At timing $t_2$ to start light emission indicated in the second light emission timing signal, the switching control signal generation circuit 53 starts again the process illustrated in FIG. 3.

At step S100, the switching control signal generation circuit 53 determines whether the reactor current 45 is greater than the present current command value, i.e., the second current command value 4a-2.

At step S100, the switching control signal generation circuit 53 determines that the reactor current 45 is greater than the second current command value 4a-2 (Yes) and allows the process to proceed to step S102 to start pulse width modulation control.

At step S102, the switching control signal generation circuit 53 calculates the duty cycle of the switching control signal 23a.

The switching control signal generation circuit 53 calculates the duty cycle of the light-emitting unit current 24 using Equation (1) shown below:

$$\text{(Duty cycle of light-emitting unit current)} = \text{(Present current command value/Reactor current)} \quad (1)$$

The light-emitting unit current 24 does not flow when the switching element 21 is in an ON state, and flows when the switching element 21 is in an OFF state. That is, the light-emitting unit current 24 and the switching element 21 have opposite logical states. Accordingly, the switching control signal generation circuit 53 calculates the duty cycle of the switching control signal 23a using Equation (2) shown below:

$$\text{(Duty cycle of switching control signal)} = (1 - \text{(Duty cycle of light-emitting unit current)}) \quad (2)$$

For example, when the second current command value 4a-2 is "10 A" and the reactor current 45 is "50 A", the switching control signal generation circuit 53 calculates the duty cycle of the light-emitting unit current 24 as 10/50=0.2. Thus, the switching control signal generation circuit 53 calculates the duty cycle of the switching control signal 23a as (1−0.2)=0.8.

At step S104, the switching control signal generation circuit 53 performs pulse width modulation on the switching control signal 23a on the basis of the duty cycle calculated using Equation (2) and thus provides pulse width modulation control of the switching element 21.

This operation provides pulse width modulation control of the switching element 21. Thus, the light-emitting unit current 24 having the duty cycle calculated using Equation (1) flows to the light-emitting unit 3, thereby allowing the electromagnetic energy stored in the reactor 42c to be consumed in the light-emitting unit 3. Accordingly, the reactor current 45 decreases by the amount corresponding to the electromagnetic energy consumed in the light-emitting unit 3.

At step S106, the switching control signal generation circuit 53 waits until one period of the carrier signal for the pulse width modulation elapses (No). When one period of the carrier signal for the pulse width modulation has elapsed (Yes), the process proceeds to step S108.

Examples of the waveform of the carrier signal for the pulse width modulation include a triangular waveform and a sawtooth waveform.

At step S108, the switching control signal generation circuit 53 determines whether the reactor current 45 has reached the second current command value 4a-2.

If, at step S108, the switching control signal generation circuit 53 determines that the reactor current 45 has not yet reached the second current command value 4a-2 (No), the process proceeds to step S102.

That is, the switching control signal generation circuit 53 repeatedly performs steps S102 to S108 every period of the carrier signal until the reactor current 45 reaches the second current command value 4a-2.

Otherwise, if, at step S108, the switching control signal generation circuit 53 determines that the reactor current 45 has reached the second current command value 4a-2 (Yes), the switching control signal generation circuit 53 terminates the pulse width modulation control and allows the process to proceed to step S110. This operation is performed because when the reactor current 45 reaches the second current command value 4a-2, the duty cycle of the light-emitting unit current 24 becomes 1.0, meaning that the duty cycle of the switching control signal 23a becomes (1−1.0)=0; and thus, the switching control signal generation circuit 53 can provide control to allow the switching element 21 to transition to an OFF state.

Referring to FIG. 4, when the reactor current 45 reaches the second current command value 4a-2 at timing $t_3$ after timing $t_2$, the switching control signal generation circuit 53 terminates the pulse width modulation control and turns off the switching control signal 23a to provide control to allow the switching element 21 to transition to an OFF state.

Figure 5:
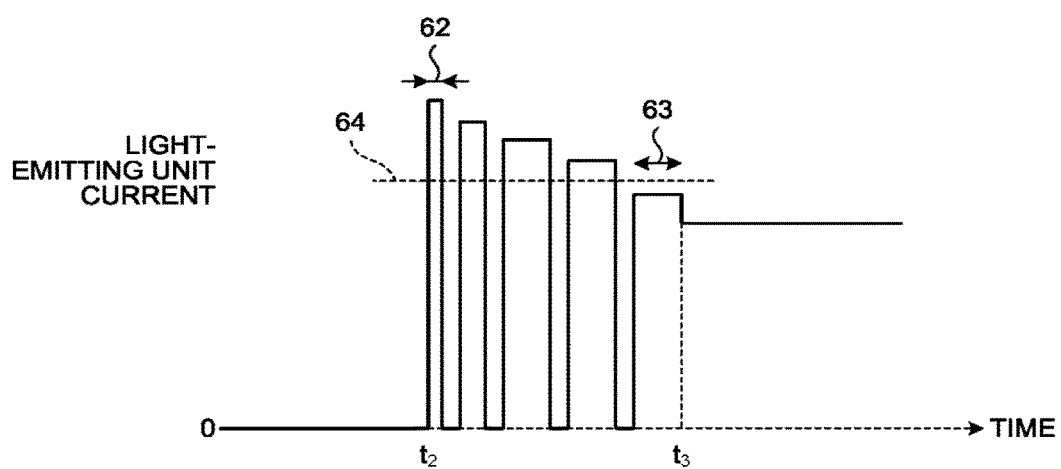
FIG. 5 is a waveform chart for explaining the operation of the current control device according to the first embodiment.

FIG. 5 is a waveform chart for explaining the operation of the current control device according to the first embodiment. FIG. 5 is an enlarged chart of a section 61 from timing $t_2$ to timing $t_3$ of the light-emitting unit current 24 of FIG. 4.

Immediately after timing $t_2$, the reactor current 45 differs significantly from the second current command value 4a-2. As the electromagnetic energy stored in the reactor 42c is consumed in the light-emitting unit 3 over time, the difference between the value of the reactor current 45 and the second current command value 4a-2 decreases. Thus, as time passes, the duty cycle of the light-emitting unit current 24 increases. That is, the length 63 of the ripple of the light-emitting unit current 24 in the time direction immediately before timing $t_3$ is longer than the length 62 of the ripple of the light-emitting unit current 24 in the time direction immediately after timing $t_2$. The amplitude of the light-emitting unit current 24, which is the same as the amplitude of the reactor current 45, decreases over time. A broken line 64 indicates the average value of the light-emitting unit current 24 from timing $t_2$ to timing $t_3$.

Immediately after timing $t_2$, the amplitude of a ripple of the light-emitting unit current 24 momentarily exceeds the second current command value 4a-2. However, use of a carrier signal frequency for pulse width modulation control on the order of several hundreds of kilohertz enables the current control device 20 to reduce the length of the ripple of the light-emitting unit current 24 in the time direction. Thus, the current control device 20 can reduce the impact on the workpiece.

Figure 6:
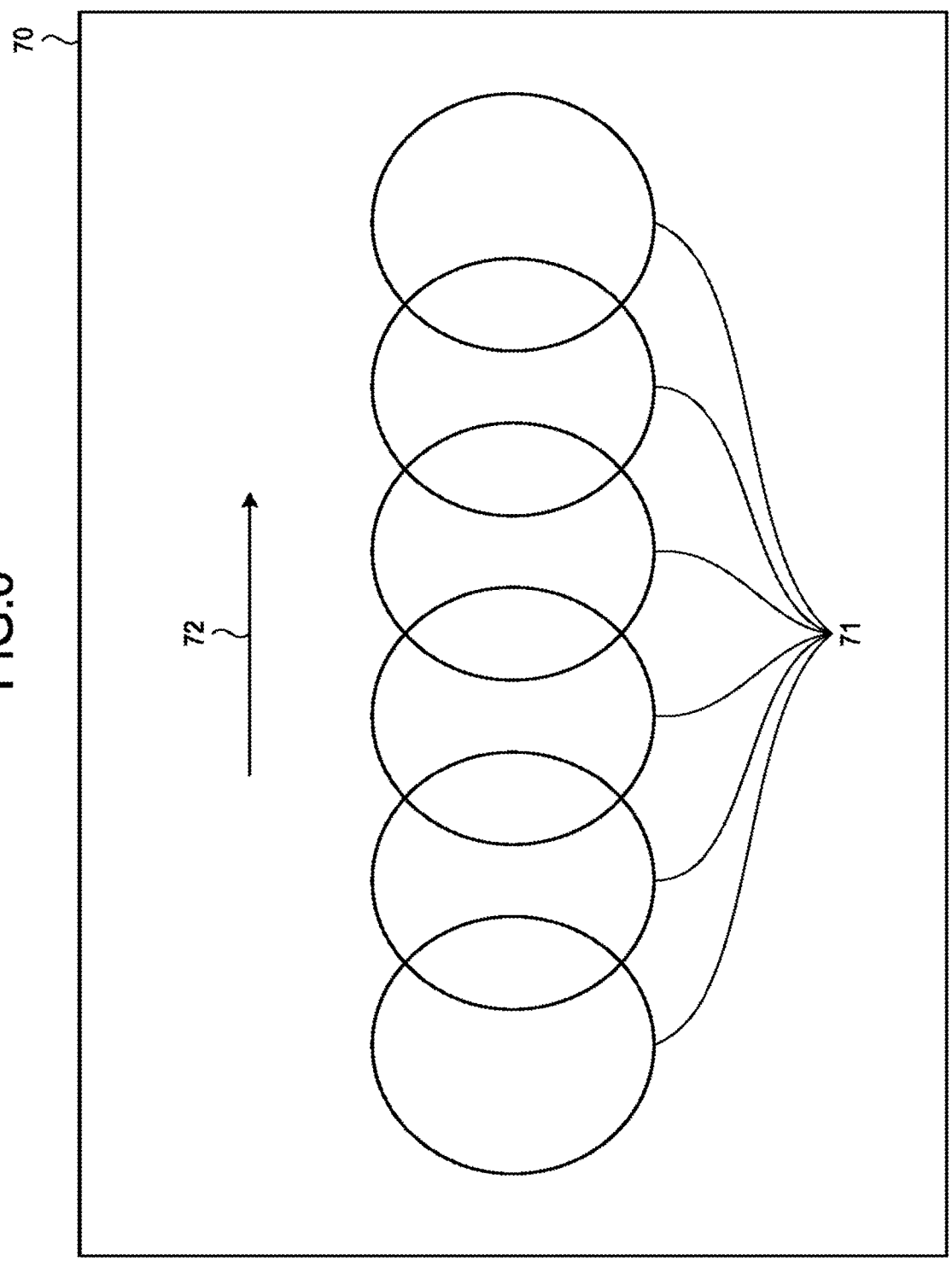
FIG. 6 is a diagram illustrating traces on a machined surface of a beam emitted from a light-emitting unit driven by the laser-diode power supply apparatus that includes the current control device according to the first embodiment.

FIG. 6 is a diagram illustrating traces on a machined surface of a beam emitted from the light-emitting unit driven by the laser-diode power supply apparatus that includes the current control device according to the first embodiment. FIG. 6 is a diagram illustrating traces of a beam 71 emitted onto a machined surface 70 during a time period from timing $t_2$ to timing $t_3$. An arrow 72 indicates the moving direction of the beam 71.

During a time period from timing $t_2$ to timing $t_3$, the light-emitting unit 3 is pulse width modulation controlled and thus the light-emitting unit 3 emits light intermittently. Thus, as illustrated in FIG. 6, the beam 71 is emitted onto the machined surface 70 intermittently.

FIG. 6 illustrates traces of the beam 71 when a carrier signal frequency for the pulse width modulation control on the order of several kilohertz to several tens of kilohertz is used. In this case, even when the light-emitting unit 3 is caused to emit light intermittently by the use of pulse width modulation control, it is possible to achieve machining performance nearly as high as machining performance that would be achieved when the light-emitting unit 3 is caused to emit light continuously without pulse width modulation control.

Figure 7:
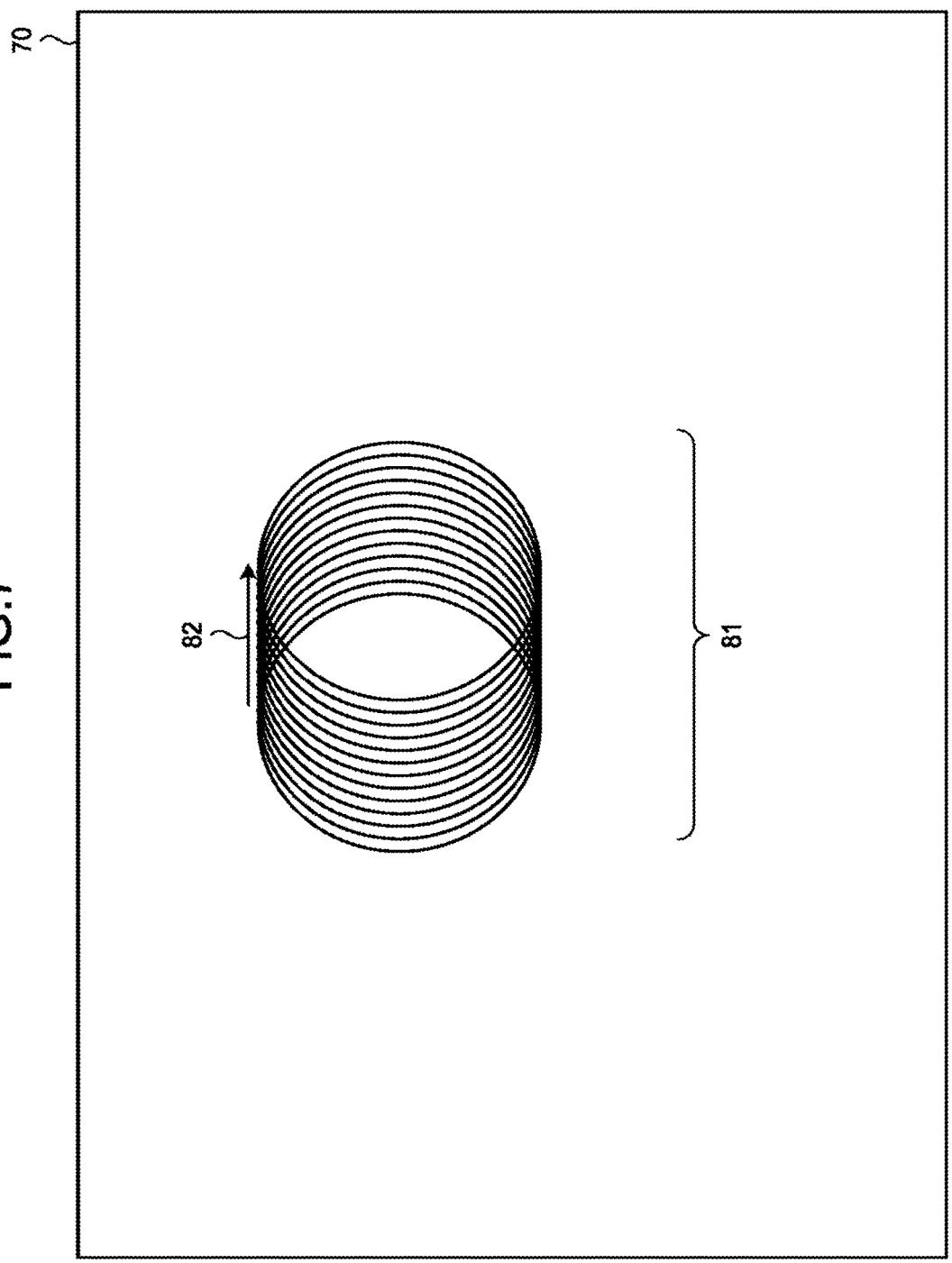
FIG. 7 is another diagram illustrating traces on a machined surface of a beam emitted from the light-emitting unit driven by the laser-diode power supply apparatus that includes the current control device according to the first embodiment.

FIG. 7 is another diagram illustrating traces on a machined surface of a beam emitted from the light-emitting unit driven by the laser-diode power supply apparatus that includes the current control device according to the first embodiment. FIG. 7 is a diagram illustrating traces of a beam 81 emitted onto the machined surface 70 during a time period from timing $t_2$ to timing $t_3$. An arrow 82 indicates the moving direction of the beam 81.

Since high productivity is required in laser machining, the moving speed of the beam 71 on the machined surface 70, i.e., the machining speed, of from about 10 m per minute to 50 m per minute is often used. In this regard, use of a carrier signal frequency for pulse width modulation control on the order of several hundreds of kilohertz and use of the ripple frequency of the light-emitting unit current 24 on the order of several hundreds of kilohertz will result in the effect on machining on the machined surface 70 of about several micrometers.

For example, use of the machining speed of 10 m per minute on the machined surface 70 causes an interval between ripples of the light-emitting unit current 24 at 100 kHz to be 1.67 μm. As compared to the minimum beam diameter of about 100 μm used in sheet metal laser machining, the interval between ripples of the light-emitting unit current 24 of 1.67 μm is less than or equal to the beam diameter of 100 μm. Thus, use of a higher carrier signal frequency for pulse width modulation control enables a greater overlap to occur between beam traces. This can achieve machining performance nearly as high as machining performance that would be achieved when the light-emitting unit 3 is caused to emit light continuously without pulse width modulation control.

The description returns to the operation of the current control device 20.

Referring again to FIG. 3, at step S110, the switching control signal generation circuit 53 turns off the switching control signal 23a. This operation causes the switching element 21 to transition to an OFF state and thereby causes the reactor current 45 to flow to the light-emitting unit 3 rather than to the switching element 21. In this situation, the reactor current 45 has reached the second current command value 4a-2, and thus it is suitable if the reactor current 45 flows to the light-emitting unit 3 rather than to the switching element 21.

At step S112, the switching control signal generation circuit 53 waits until timing $t_4$ (No), which is the time to terminate light emission indicated in the second light emission timing signal, and at timing $t_4$ (Yes), allows the process to proceed to step S114.

At step S114, the switching control signal generation circuit 53 turns on the switching control signal 23a and then terminates the process. This operation causes the switching element 21 to transition to an ON state and thereby causes the reactor current 45 to flow to the switching element 21 rather than to the light-emitting unit 3.

During a time period from timing $t_4$ to timing $t_5$ to start light emission indicated in the third light emission timing signal, the reactor current 45 gradually decreases due to the circuit losses in the switching element 21, in the snubber circuit 22, and in the diode 42b.

At timing $t_5$ to start light emission indicated in the third light emission timing signal, the switching control signal generation circuit 53 starts again the process illustrated in FIG. 3.

In addition, at timing t5, the current output unit 40 provides control such that the reactor current 45 becomes current corresponding to the third current command value 4a-3. Upon a change in the current command value to the third current command value 4a-3, which is greater than the second current command value 4a-2, the current output unit 40 increases the amount of the electromagnetic energy stored in the reactor 42c to increase the reactor current 45. In this case, the constant-voltage output unit 30 can take more electrical power from the system power supply 2 to supply electrical power to the current output unit 40. Thus, in the current output unit 40, the reactor current 45 is increased more rapidly than the reactor current 45 decreases.

At step S100, the switching control signal generation circuit 53 determines whether the reactor current 45 is greater than the present current command value, i.e., the third current command value 4a-3.

At step S100, the switching control signal generation circuit 53 determines that the reactor current 45 is less than the third current command value 4a-3 (No) and allows the process to proceed to step S110.

At step S110, the switching control signal generation circuit 53 turns off the switching control signal 23a. This operation causes the switching element 21 to transition to an OFF state and thereby causes the reactor current 45 to flow to the light-emitting unit 3 rather than to the switching element 21.

The subsequent operations of the switching control signal generation circuit 53 are similar to those described above, and thus, the description thereof will be omitted.

As described above, the current control device 20 according to the first embodiment provides pulse width modulation control of the switching element 21 to perform pulse width modulation on the light-emitting unit current 24 until the reactor current 45 reaches the present current command value 4a if the reactor current 45 is greater than the present current command value 4a upon the start of supply of the light-emitting unit current 24, thereby allowing the electromagnetic energy stored in the reactor 42c to be consumed in the light-emitting unit 3, and at the same time, enabling the light-emitting unit 3 to emit light.

Thus, even when the power supply device 10 reduces the reactor current 45 slowly, the current control device 20 can suitably control the light-emitting unit current 24 and thus cause the light-emitting unit 3 to suitably emit light. Accordingly, the current control device 20 enables suitable machining of a workpiece to be provided.

Note that observation of only the time period from timing $t_2$ to timing $t_3$ of FIG. 4 shows that the value of the light-emitting unit current 24 slightly differs from the current command value 4a. However, observation of the entire time period of light emission from timing $t_2$ to timing $t_4$ shows that the value of the light-emitting unit current 24 generally matches the current command value 4a. Accordingly, the current control device 20 enables suitable machining of a workpiece to be provided.

In addition, the current control device 20 allows the light-emitting unit 3 to consume the electromagnetic energy stored in the reactor 42c. This eliminates the need for the current control device 20 to further include an element to consume the electromagnetic energy stored in the reactor 42c.

Accordingly, the current control device 20 can reduce the number of components, reduce the footprint, and reduce the cost.

Note that a large apparatus such as a laser machine often includes the power supply device 10 and the light-emitting unit 3 at locations separated apart from each other. In such a case, a wire between the switching element 21 and the light-emitting unit 3 may become long and this may create difficulties in suitably controlling the light-emitting unit current 24 due to the parasitic inductance of the wire.

Therefore, disposing both the switching element 21 and the light-emitting unit 3 within one module is suitable.

Figure 8:
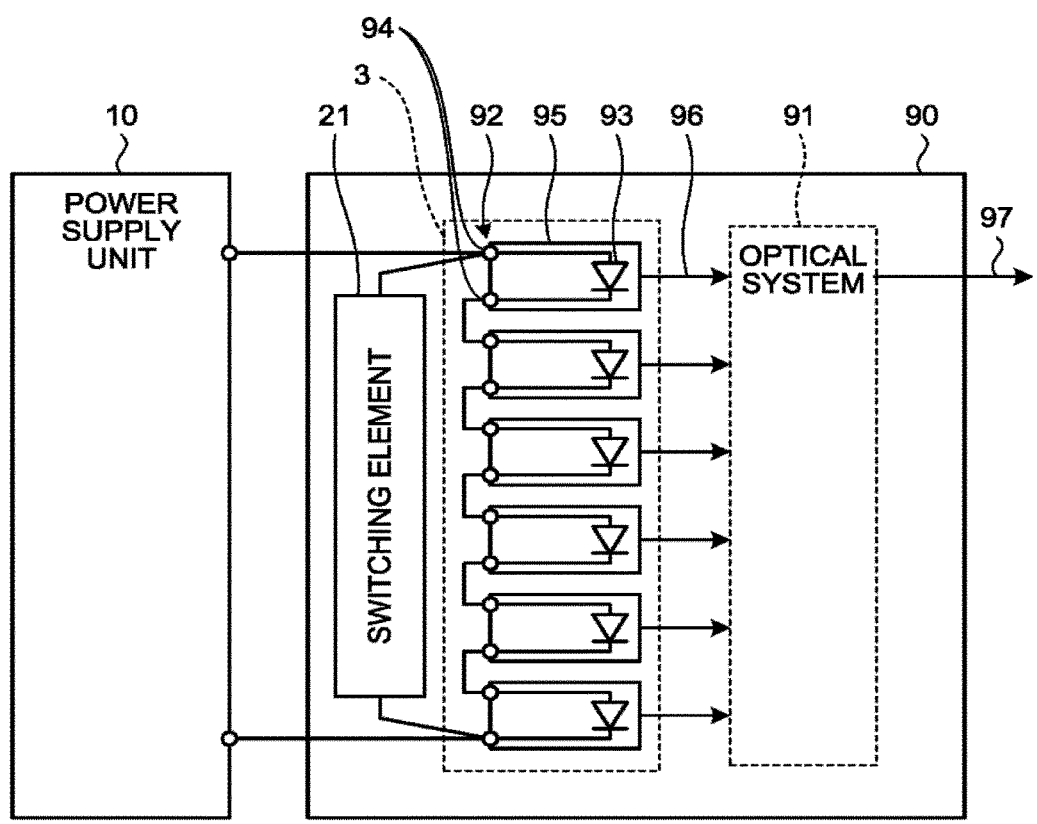
FIG. 8 is a diagram illustrating an example of implementation of the current control device according to the first embodiment.

FIG. 8 is a diagram illustrating an example of implementation of the current control device according to the first embodiment. A module 90 is configured to include the switching element 21, the light-emitting unit 3, and an optical system 91.

The light-emitting unit 3 includes multiple laser diode packages 92 coupled together in series. Each of the laser diode packages 92 is configured to include a laser diode bar 93, which is the main body of the laser diode and has a bar shape; electrodes 94 that conduct electricity to the laser diode bar 93; and a heat sink 95 for dissipating heat from the laser diode bar 93.

Multiple light beams 96 respectively output from the multiple laser diode packages 92 are directed to the optical system 91. Examples of the optical system 91 include a lens and a mirror. The optical system 91 collects and converges the multiple light beams 96 into one light beam 97 and outputs the light beam 97 to an optical fiber.

Note that the snubber circuit 22 and the PWM control circuit unit 23 may be included in the module 90 or may be included in the power supply device 10.

According to the current control device 20 in the first embodiment, by disposing both the switching element 21 and the light-emitting unit 3 within one module 90, a wire to be used between the switching element 21 and the light-emitting unit 3 can be shortened, thereby enabling the parasitic inductance of the wire between the switching element 21 and the light-emitting unit 3 to be reduced. Thus, the current control device 20 can cause the light-emitting unit current 24 to change rapidly and can thus suitably control the light-emitting unit current 24. Accordingly, the current control device 20 enables suitable machining of a workpiece to be provided.

Figure 9:
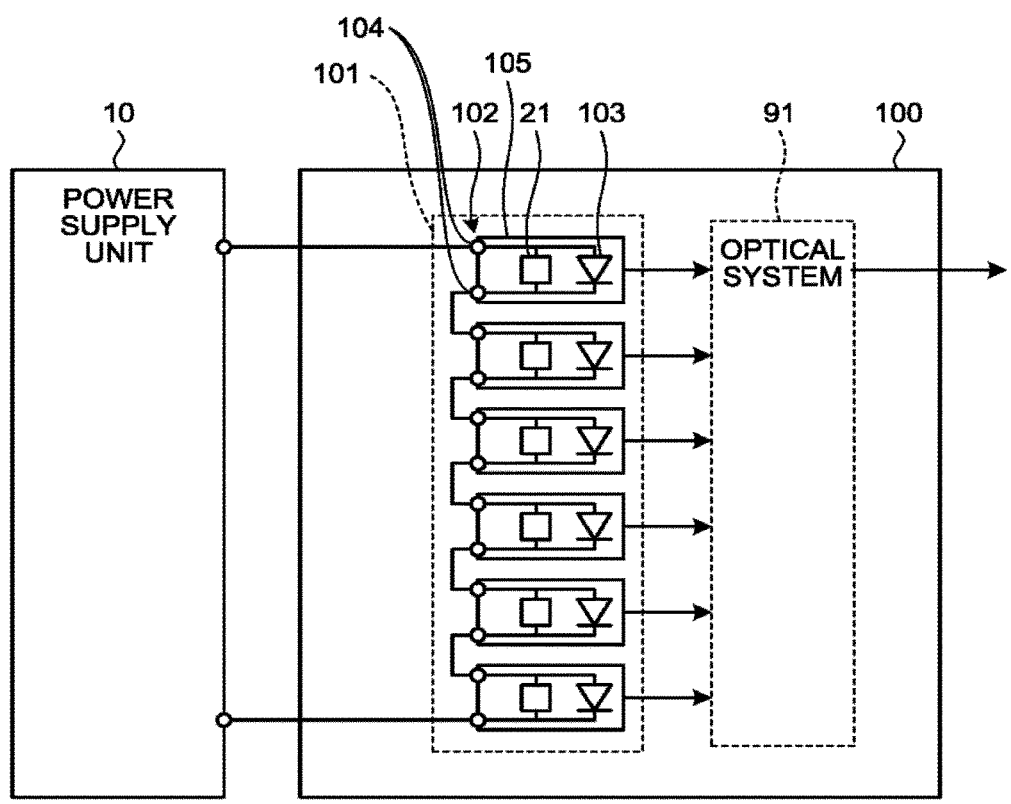
FIG. 9 is a diagram illustrating another implementation of the current control device according to the first embodiment.

FIG. 9 is a diagram illustrating another implementation of the current control device according to the first embodiment. A module 100 is configured to include a light-emitting unit 101 and the optical system 91.

The light-emitting unit 101 includes multiple laser diode packages 102 coupled together in series. Each of the laser diode packages 102 is configured to include a laser diode bar 103, which is the main body of the laser diode; electrodes 104 that conduct electricity to the laser diode bar 103; a heat sink 105 for dissipating heat from the laser diode bar 103; and the switching element 21 coupled in parallel to the laser diode bar 103.

The laser diode bar 103 and the switching element 21 may be formed on one semiconductor chip.

Switching of the multiple switching elements 21 respectively included in the multiple laser diode packages 102 is controlled by means of the single switching control signal 23a.

According to the current control device 20 in the first embodiment, the process of attaching the switching element 21 to the light-emitting unit 101 can be eliminated. Thus, the current control device 20 can simplify the manufacturing process of the module 100. Moreover, the current control device 20 can reduce the manufacturing cost of the module 100.

Figure 10:
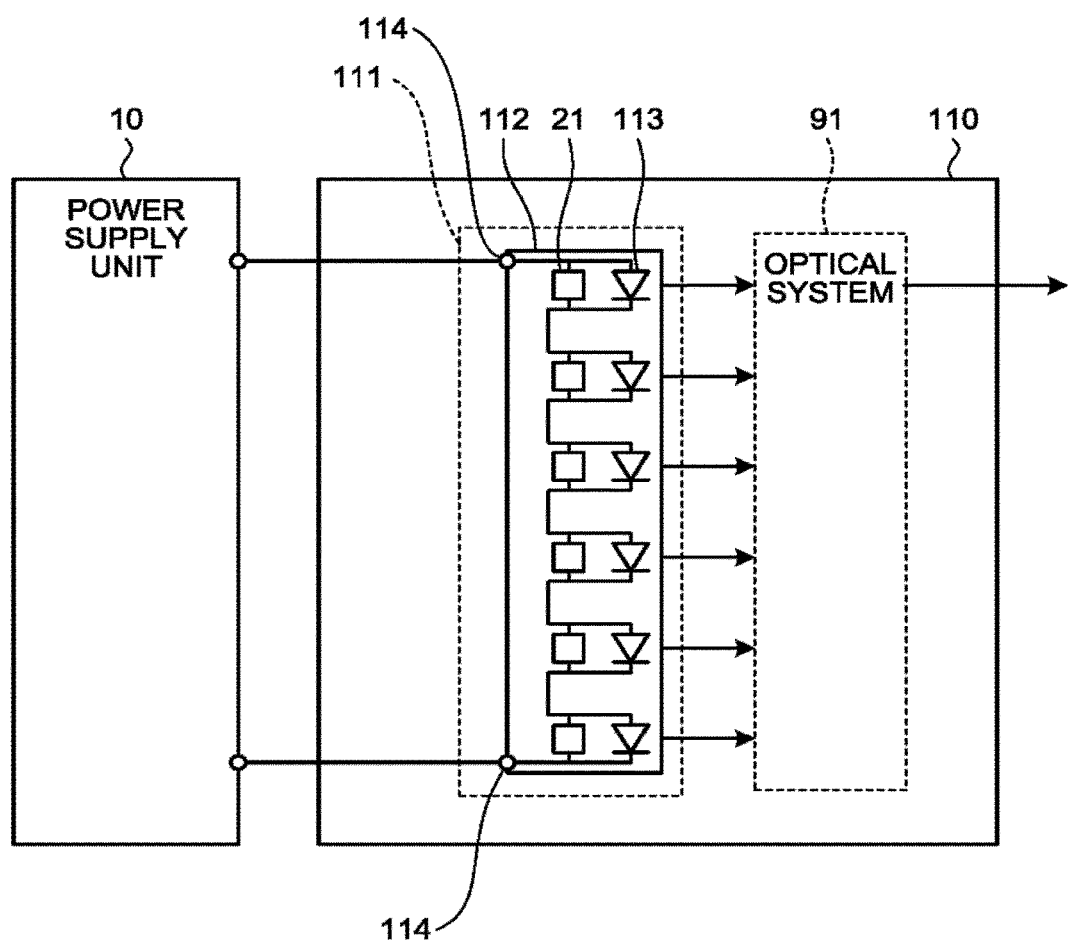
FIG. 10 is a diagram illustrating still another implementation of the current control device according to the first embodiment.

FIG. 10 is a diagram illustrating still another implementation of the current control device according to the first embodiment. A module 110 is configured to include a light-emitting unit 111 and the optical system 91.

The light-emitting unit 111 includes a single heat sink 112; multiple laser diodes bars 113 mounted on the heat sink 112 and coupled together in series; multiple switching elements 21 respectively coupled in parallel to the multiple laser diodes bars 113; and a pair of electrodes 114 that conduct electricity to the laser diodes bars 113.

According to the current control device 20 in the first embodiment, the single heat sink 112 and the pair of electrodes 114 can be shared by the laser diodes bars 113. Thus, the current control device 20 can reduce the number of components and reduce the number of manufacturing steps. Accordingly, the current control device 20 can simplify the manufacturing process of the module 110. Moreover, the current control device 20 can reduce the manufacturing cost of the module 110.

Figure 11:
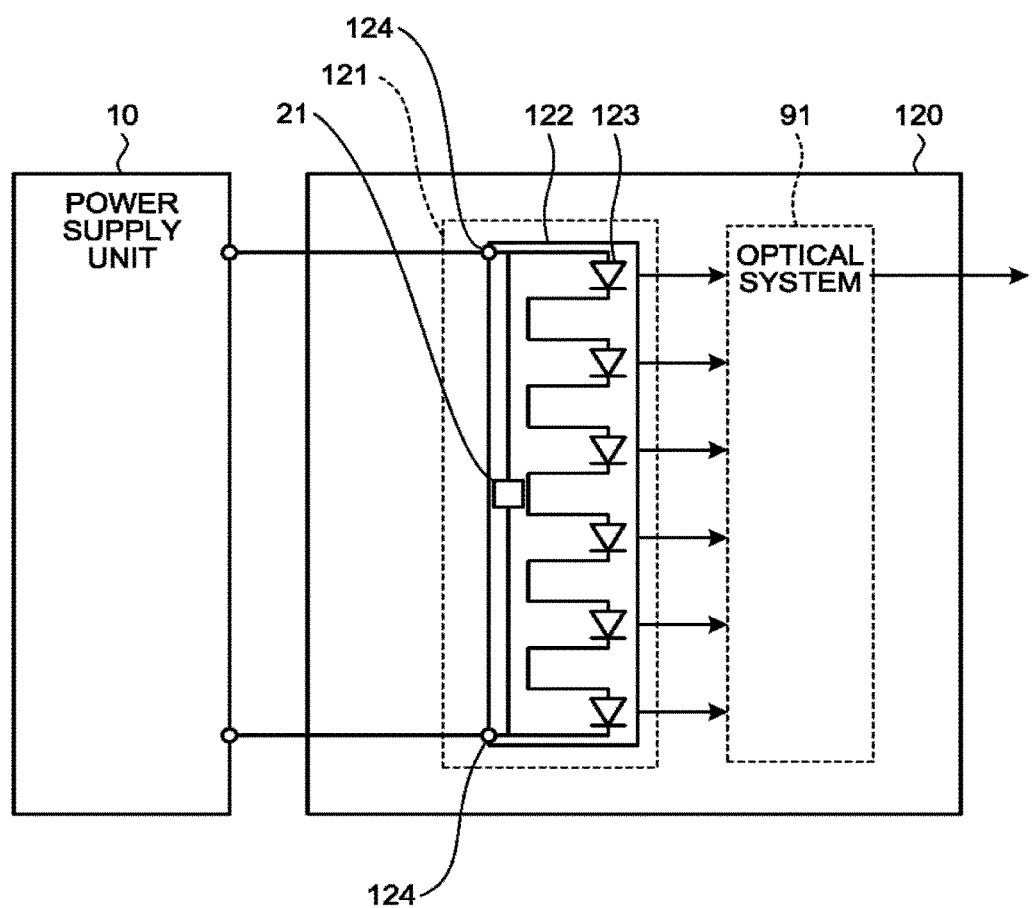
FIG. 11 is a diagram illustrating still another implementation of the current control device according to the first embodiment.

FIG. 11 is a diagram illustrating still another implementation of the current control device according to the first embodiment. A module 120 is configured to include a light-emitting unit 121 and the optical system 91.

The light-emitting unit 121 is configured to include a single heat sink 122; multiple laser diodes bars 123 mounted on the heat sink 122 and coupled together in series; the single switching element 21 coupled in parallel to the multiple laser diodes bars 123; and a pair of electrodes 124 that conduct electricity to the laser diodes bars 123.

According to the current control device 20 in the first embodiment, the single switching element 21, the single heat sink 122, and the pair of electrodes 124 can be shared by the laser diodes bars 123. Thus, the current control device 20 can reduce the number of components and reduce the number of steps in manufacturing the module 120. Accordingly, the current control device 20 can simplify the manufacturing process of the module 120. Moreover, the current control device 20 can reduce the manufacturing cost of the module 120.

In addition, when a comparison is made for the module 120 illustrated in FIG. 11 and the module 90 illustrated in FIG. 8, the module 120 illustrated in FIG. 11 is configured such that the switching element 21 is mounted on the heat sink 122. This configuration allows the heat sink 122 to cool the laser diodes bars 123 and also to cool the switching element 21. Thus, the current control device 20 can prevent a change by heat in electrical characteristics of the switching element 21 and can thus suitably control the light-emitting unit current 24. Accordingly, the current control device 20 enables suitable machining of a workpiece to be provided.

Second Embodiment

Figure 12:
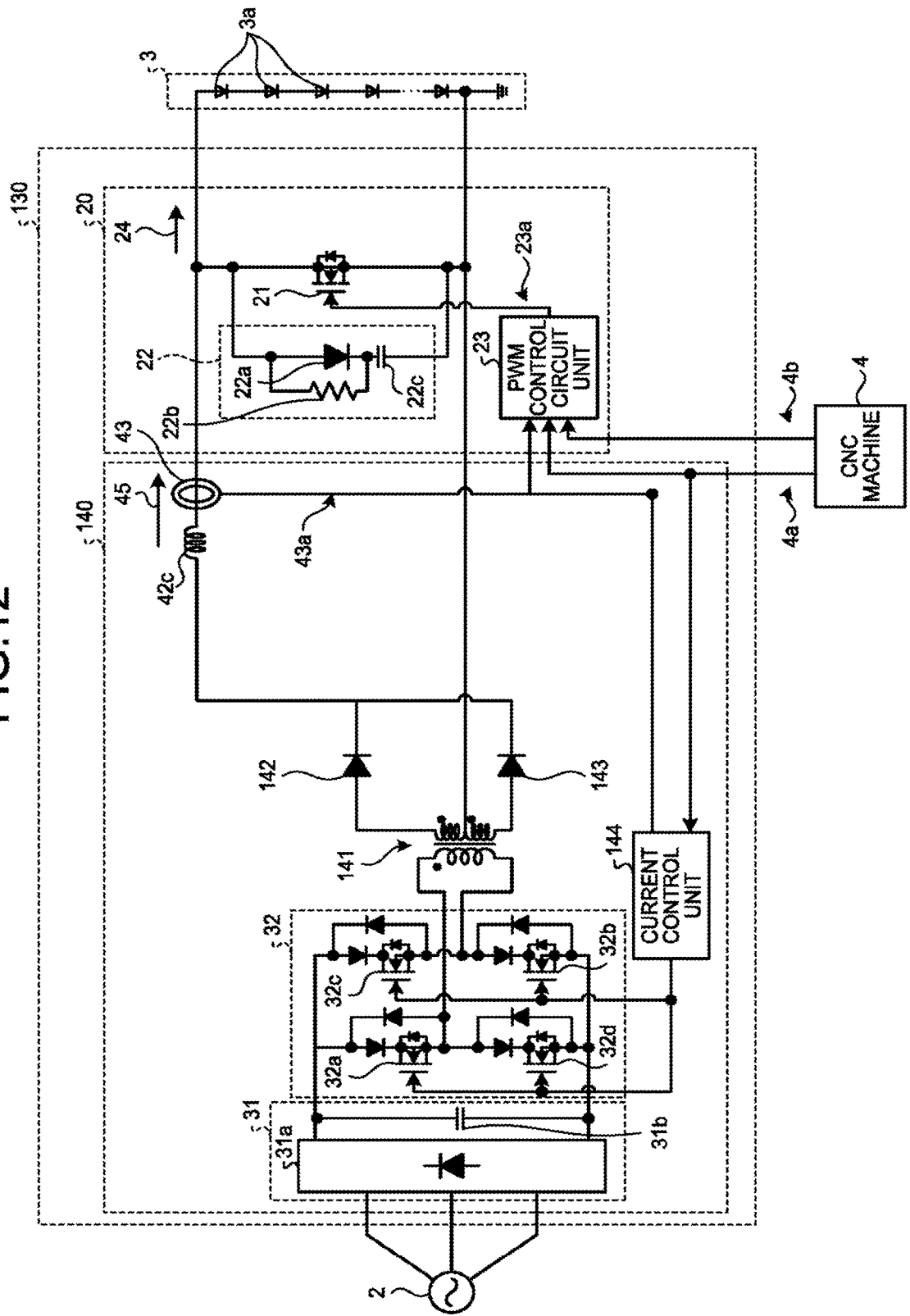
FIG. 12 is a diagram illustrating a configuration of a laser-diode power supply apparatus that includes a current control device according to a second embodiment.

FIG. 12 is a diagram illustrating a configuration of a laser-diode power supply apparatus that includes a current control device according to a second embodiment. A laser-diode power supply apparatus 130 according to the second embodiment includes a power supply device 140 in place of the power supply device 10 as compared to the laser-diode power supply apparatus 1 according to the first embodiment illustrated in FIG. 1.

The power supply device 10 described in the first embodiment includes the step-down chopper unit 42 that steps down the DC voltage applied by the DC conversion unit 41.

The power supply device 140 described in the second embodiment does not include the step-down chopper unit 42. In a case in which the laser output of the light-emitting unit 3 is low and thus the required power supply capacity can be low, the step-down chopper unit 42 may be omitted.

The power supply device 140 includes a transformer 141 that transforms the AC voltage applied to the primary winding of the transformer 141 by the inverter unit 32 and outputs the converted AC voltage from the secondary winding of the transformer 141; a diode 142 having an anode connected to one end of the secondary winding of the transformer 141; and a diode 143 having an anode connected to the other end of the secondary winding of the transformer 141.

The diodes 142 and 143 have cathodes connected to one end of the reactor 42c. The diodes 142 and 143 together full-wave rectify the voltage of the secondary winding of the transformer 141 and output the full-wave rectified voltage to the reactor 42c.

The intermediate terminal of the secondary winding of the transformer 141 functions as a lower-potential output line and is connected to the cathode side of the light-emitting unit 3.

The power supply device 140 includes a current control unit 144 that receives an input of the detected current value 43a and controls the inverter unit 32 such that the reactor current becomes current corresponding to the current command value 4a.

Note that if leakage inductance of the transformer 141 can be utilized instead of using the reactor 42c, the reactor 42c may be omitted.

According to the laser-diode power supply apparatus 130 in the second embodiment, the circuit size can be reduced and the number of components can be reduced. Thus, the laser-diode power supply apparatus 130 can reduce the footprint and can thus reduce the product size. Moreover, the laser-diode power supply apparatus 130 can reduce the cost.

Third Embodiment

The configuration of a laser-diode power supply apparatus that includes a current control device according to a third embodiment is similar to the configuration of the laser-diode power supply apparatus 1 according to the first embodiment illustrated in FIG. 1 or to the configuration of the laser-diode power supply apparatus 130 according to the second embodiment illustrated in FIG. 12, and thus, the illustration and the description thereof will be omitted.

Figure 13:
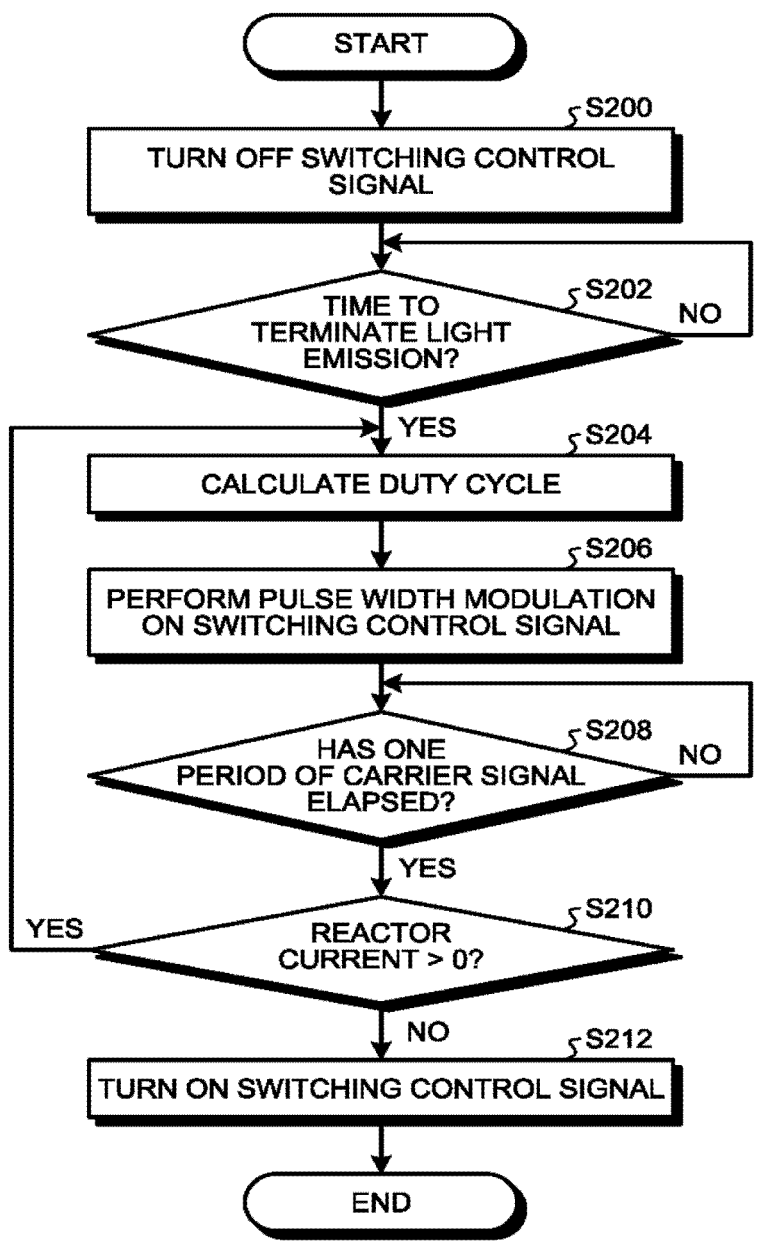
FIG. 13 is a flowchart illustrating an operation of a current control device according to a third embodiment.
Figure 14:
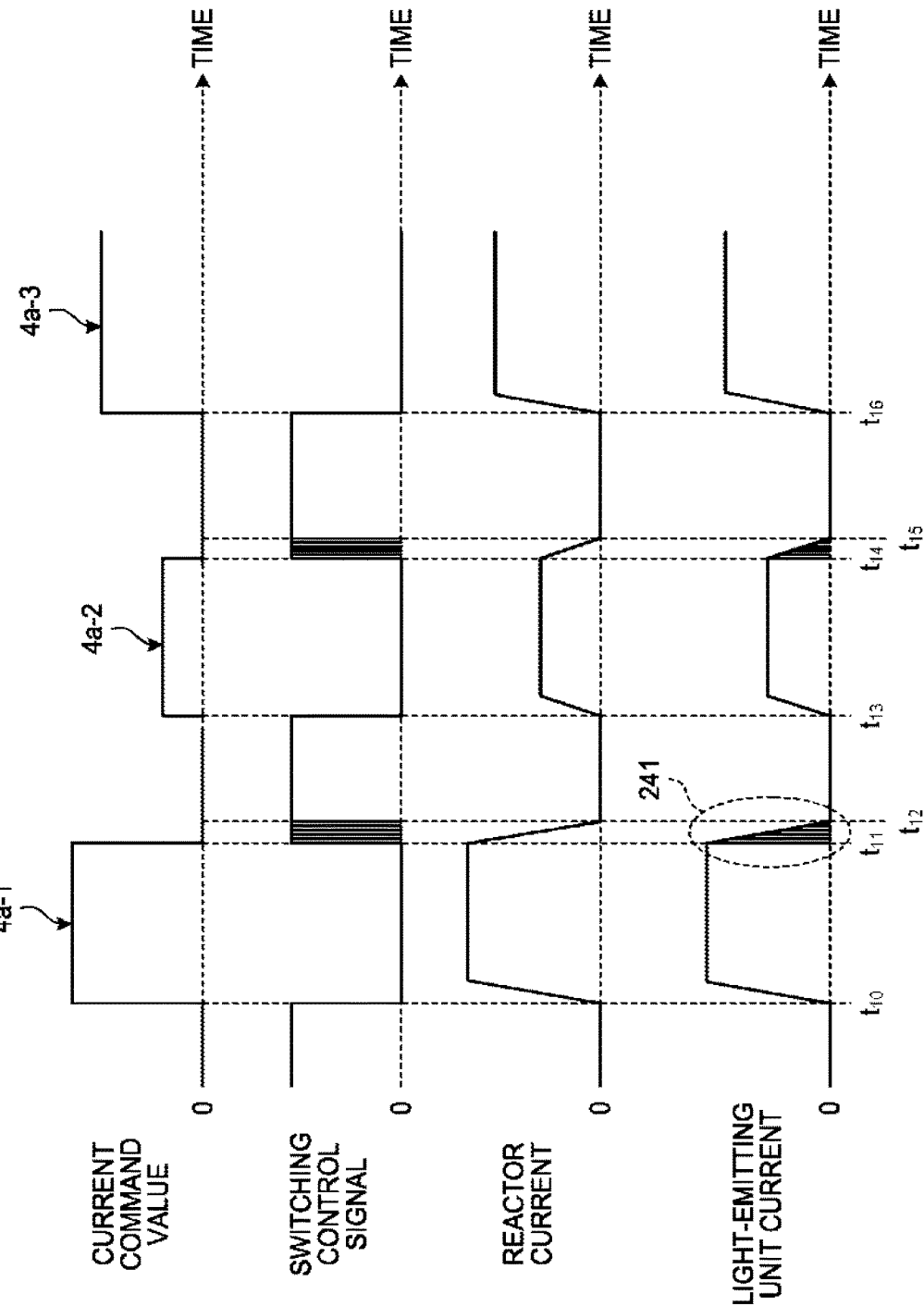
FIG. 14 is a waveform chart for explaining the operation of the current control device according to the third embodiment.

FIG. 13 is a flowchart illustrating an operation of the current control device according to the third embodiment. FIG. 14 is a waveform chart for explaining the operation of the current control device according to the third embodiment. FIG. 14 illustrates a waveform of the current command value 4a, a waveform of the switching control signal 23a, a waveform of the reactor current 45, and a waveform of the light-emitting unit current 24.

The switching control signal generation circuit 53 starts the process illustrated in FIG. 13 at timing $t_{10}$, which is the time to start light emission indicated in the first light emission timing signal.

In addition, at timing $t_{10}$, the power supply device 10 or 140 starts outputting the reactor current 45 based on the first current command value 4a-1.

Referring to FIG. 13, at step S200, the switching control signal generation circuit 53 turns off the switching control signal 23a. This operation causes the switching element 21 to transition to an OFF state and thereby causes the reactor current 45 to flow to the light-emitting unit 3 rather than to the switching element 21.

At step S202, the switching control signal generation circuit 53 waits until timing $t_{11}$ (No), which is the time to terminate light emission indicated in the first light emission timing signal, and at timing $t_{11}$ (Yes), allows the process to proceed to step S204.

Note that, at timing $t_{11}$, the power supply device 10 or 140 provides control such that the reactor current 45 becomes "0 A". However, as described above, the power supply device 10 or 140 has stored electromagnetic energy in the reactor 42c, and besides, includes no element to consume the electromagnetic energy stored in the reactor 42c. Accordingly, the responsivity to reduce the reactor current 45 is low.

At step S204, the switching control signal generation circuit 53 calculates the duty cycle of the switching control signal 23a.

The switching control signal generation circuit 53 calculates the duty cycle of the light-emitting unit current 24 using Equation (3) shown below.

(Duty cycle of light-emitting unit current)=(X/Reactor current)  (3)

Here, X is a positive constant. X is determined taking into account various conditions. Use of a larger X allows the reactor current 45 to approach "0 A" more rapidly. Use of a smaller X allows the light-emitting unit current 24 to be reduced and can thus reduce the intensity of the light emitted by the light-emitting unit 3 accordingly, thereby enabling the impact on the workpiece to be reduced.

Then, the switching control signal generation circuit 53 calculates the duty cycle of the switching control signal 23a using Equation (2) described in the first embodiment.

At step S206, the switching control signal generation circuit 53 performs pulse width modulation on the switching control signal 23a on the basis of the duty cycle calculated using Equation (2) and thus provides pulse width modulation control of the switching element 21.

This operation provides pulse width modulation control of the switching element 21. Thus, the light-emitting unit current 24 having the duty cycle calculated using Equation (3) flows to the light-emitting unit 3, thereby allowing the electromagnetic energy stored in the reactor 42c to be consumed in the light-emitting unit 3. Accordingly, the reactor current 45 decreases by the amount corresponding to the electromagnetic energy consumed in the light-emitting unit 3.

At step S208, the switching control signal generation circuit 53 waits until one period of the carrier signal for the pulse width modulation elapses (No). When one period of the carrier signal for the pulse width modulation has elapsed (Yes), the process proceeds to step S210.

At step S210, the switching control signal generation circuit 53 determines whether the reactor current 45 is higher than "0 A".

If, at step S210, the switching control signal generation circuit 53 determines that the reactor current 45 is higher than "0 A" (Yes), the process proceeds to step S204.

That is, the switching control signal generation circuit 53 repeatedly performs steps S204 to S210 every period of the carrier signal until the reactor current 45 reaches "0 A".

Otherwise, if, at step S210, the switching control signal generation circuit 53 determines that the reactor current 45 is not higher than "0 A", that is, the reactor current 45 has reached "0 A" (No), the switching control signal generation circuit 53 terminates the pulse width modulation control and allows the process to proceed to step S212.

At step S212, the switching control signal generation circuit 53 turns on the switching control signal 23a and then terminates the process.

Referring to FIG. 14, when the reactor current 45 reaches "0 A" at timing $t_{12}$ after timing $t_{11}$, the switching control signal generation circuit 53 terminates the pulse width modulation control and turns on the switching control signal 23a to provide control to allow the switching element 21 to transition to an ON state.

Figure 15:
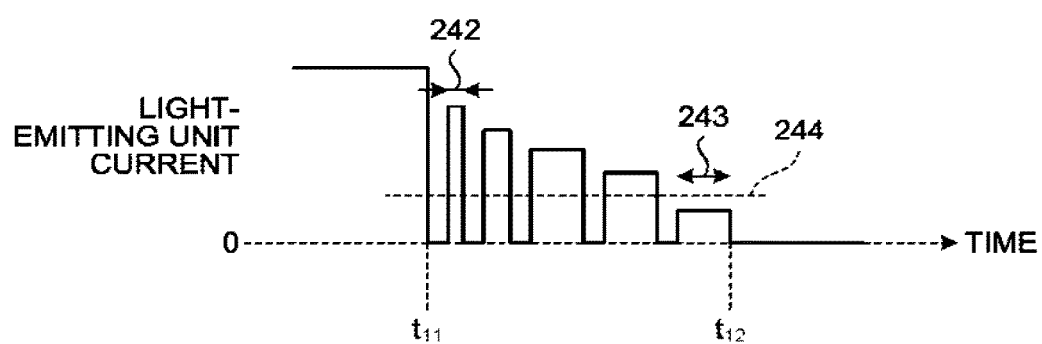
FIG. 15 is a waveform chart for explaining the operation of the current control device according to the third embodiment.

FIG. 15 is a waveform chart for explaining the operation of the current control device according to the third embodiment. FIG. 15 is an enlarged chart of a section 241 from timing $t_{11}$ to timing $t_{12}$ of the light-emitting unit current 24 of FIG. 14.

Immediately after timing $t_{11}$, the reactor current 45 differs significantly from "0 A". As the electromagnetic energy stored in the reactor 42c is consumed in the light-emitting unit 3 over time, the difference between the reactor current 45 and "0 A" decreases. Thus, as time passes, the duty cycle of the light-emitting unit current 24 increases. That is, the length 243 of the ripple of the light-emitting unit current 24 in the time direction immediately before timing $t_{12}$ is longer than the length 242 of the ripple of the light-emitting unit current 24 in the time direction immediately after timing $t_{11}$. The amplitude of the light-emitting unit current 24, which is the same as the amplitude of the reactor current 45, decreases over time. A broken line 244 indicates the average value of the light-emitting unit current 24 from timing $t_{11}$ to timing $t_{12}$.

At timing $t_{13}$ to start light emission indicated in the second light emission timing signal, the switching control signal generation circuit 53 starts again the process illustrated in FIG. 13.

In addition, at timing $t_{13}$, the power supply device 10 or 140 starts outputting the reactor current 45 based on the second current command value 4a-2.

Referring to FIG. 13, at step S200, the switching control signal generation circuit 53 turns off the switching control signal 23a. This operation causes the switching element 21 to transition to an OFF state and thereby causes the reactor current 45 to flow to the light-emitting unit 3 rather than to the switching element 21.

At step S202, the switching control signal generation circuit 53 waits until timing $t_{14}$ (No), which is the time to terminate light emission indicated in the second light emission timing signal, and at timing $t_{14}$ (Yes), allows the process to proceed to step S204.

At step S204, the switching control signal generation circuit 53 calculates the duty cycle of the switching control signal 23a.

The switching control signal generation circuit 53 calculates the duty cycle of the light-emitting unit current 24 using Equation (3).

Then, the switching control signal generation circuit 53 calculates the duty cycle of the switching control signal 23a using Equation (2) described in the first embodiment.

Note that, at timing $t_{14}$, the power supply device 10 or 140 provides control such that the reactor current 45 becomes "0 A". However, as described above, the power supply device 10 or 140 has stored electromagnetic energy in the reactor 42c, and besides, includes no element to consume the electromagnetic energy stored in the reactor 42c. Accordingly, the responsivity to reduce the reactor current 45 is low.

At step S206, the switching control signal generation circuit 53 performs pulse width modulation on the switching control signal 23a on the basis of the duty cycle calculated using Equation (2) and thus provides pulse width modulation control of the switching element 21.

This operation provides pulse width modulation control of the switching element 21. Thus, the light-emitting unit current 24 having the duty cycle calculated using Equation (3) flows to the light-emitting unit 3, thereby allowing the electromagnetic energy stored in the reactor 42c to be consumed in the light-emitting unit 3. Accordingly, the reactor current 45 decreases by the amount corresponding to the electromagnetic energy consumed in the light-emitting unit 3.

At step S208, the switching control signal generation circuit 53 waits until one period of the carrier signal for the pulse width modulation elapses (No). When one period of the carrier signal for the pulse width modulation has elapsed (Yes), the process proceeds to step S210.

At step S210, the switching control signal generation circuit 53 determines whether the reactor current 45 is higher than "0 A".

If, at step S210, the switching control signal generation circuit 53 determines that the reactor current 45 is higher than "0 A" (Yes), the process proceeds to step S204.

That is, the switching control signal generation circuit 53 repeatedly performs steps S204 to S210 every period of the carrier signal until the reactor current 45 reaches "0 A".

Otherwise, if, at step S210, the switching control signal generation circuit 53 determines that the reactor current 45 is not higher than "0 A", that is, the reactor current 45 has reached "0 A" (No), the switching control signal generation circuit 53 terminates the pulse width modulation control at timing $t_{15}$ and allows the process to proceed to step S212.

At step S212, the switching control signal generation circuit 53 turns on the switching control signal 23a and then terminates the process.

At timing $t_{16}$ to start light emission indicated in the third light emission timing signal, the switching control signal generation circuit 53 starts again the process illustrated in FIG. 13.

In addition, at timing $t_{16}$, the power supply device 10 or 140 starts outputting the reactor current 45 based on the third current command value 4a-3.

Referring to FIG. 13, at step S200, the switching control signal generation circuit 53 turns off the switching control signal 23a. This operation causes the switching element 21 to transition to an OFF state and thereby causes the reactor current 45 to flow to the light-emitting unit 3 rather than to the switching element 21.

The subsequent operations of the switching control signal generation circuit 53 are similar to those described above, and thus, the description thereof will be omitted.

As described above, the current control device 20 according to the third embodiment provides pulse width modulation control of the switching element 21 to provide pulse width modulation control of the light-emitting unit 3 until the reactor current 45 reaches "0 A" if the reactor current 45 is higher than "0 A" upon the termination of supply of the light-emitting unit current 24, thereby allowing the electromagnetic energy stored in the reactor 42c to be consumed in the light-emitting unit 3.

Thus, even when the power supply device 10 or 140 reduces the reactor current 45 slowly, the current control device 20 can suitably control the light-emitting unit current 24 and thus cause the light-emitting unit 3 to suitably emit light. Accordingly, the current control device 20 enables suitable machining of a workpiece to be provided.

In addition, the current control device 20 allows the light-emitting unit 3 to consume the electromagnetic energy stored in the reactor 42c. This eliminates the need for the current control device 20 to further include an element to consume the electromagnetic energy stored in the reactor 42c.

Accordingly, the current control device 20 can reduce the number of components, reduce the footprint, and reduce the cost.

Fourth Embodiment

The configuration of a laser-diode power supply apparatus that includes a current control device according to a fourth embodiment is similar to the configuration of the laser-diode power supply apparatus 1 according to the first embodiment illustrated in FIG. 1 or to the configuration of the laser-diode power supply apparatus 130 according to the second embodiment illustrated in FIG. 12, and thus, the illustration and the description thereof will be omitted.

Figure 16:
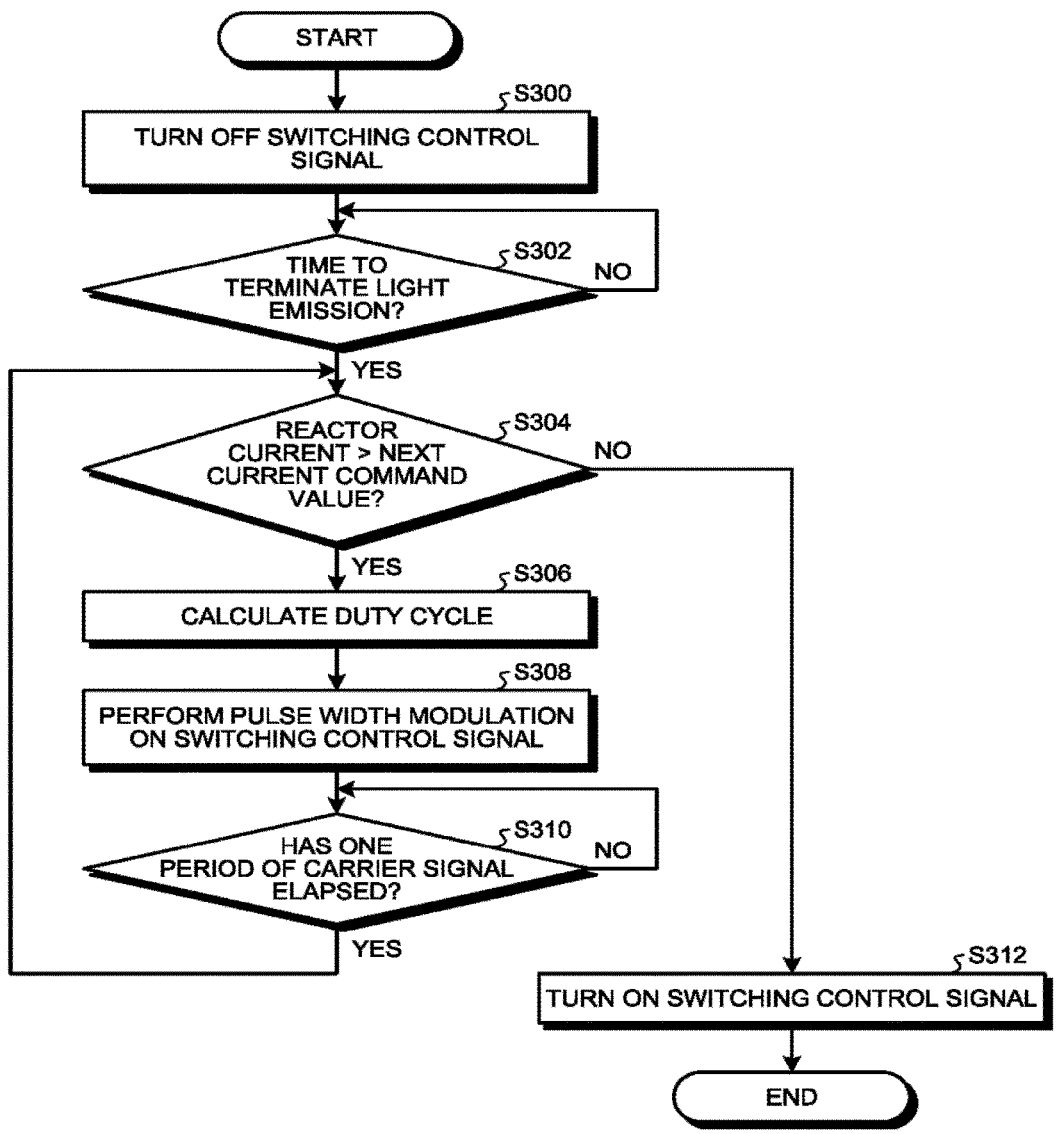
FIG. 16 is a flowchart illustrating an operation of a current control device according to a fourth embodiment.
Figure 17:
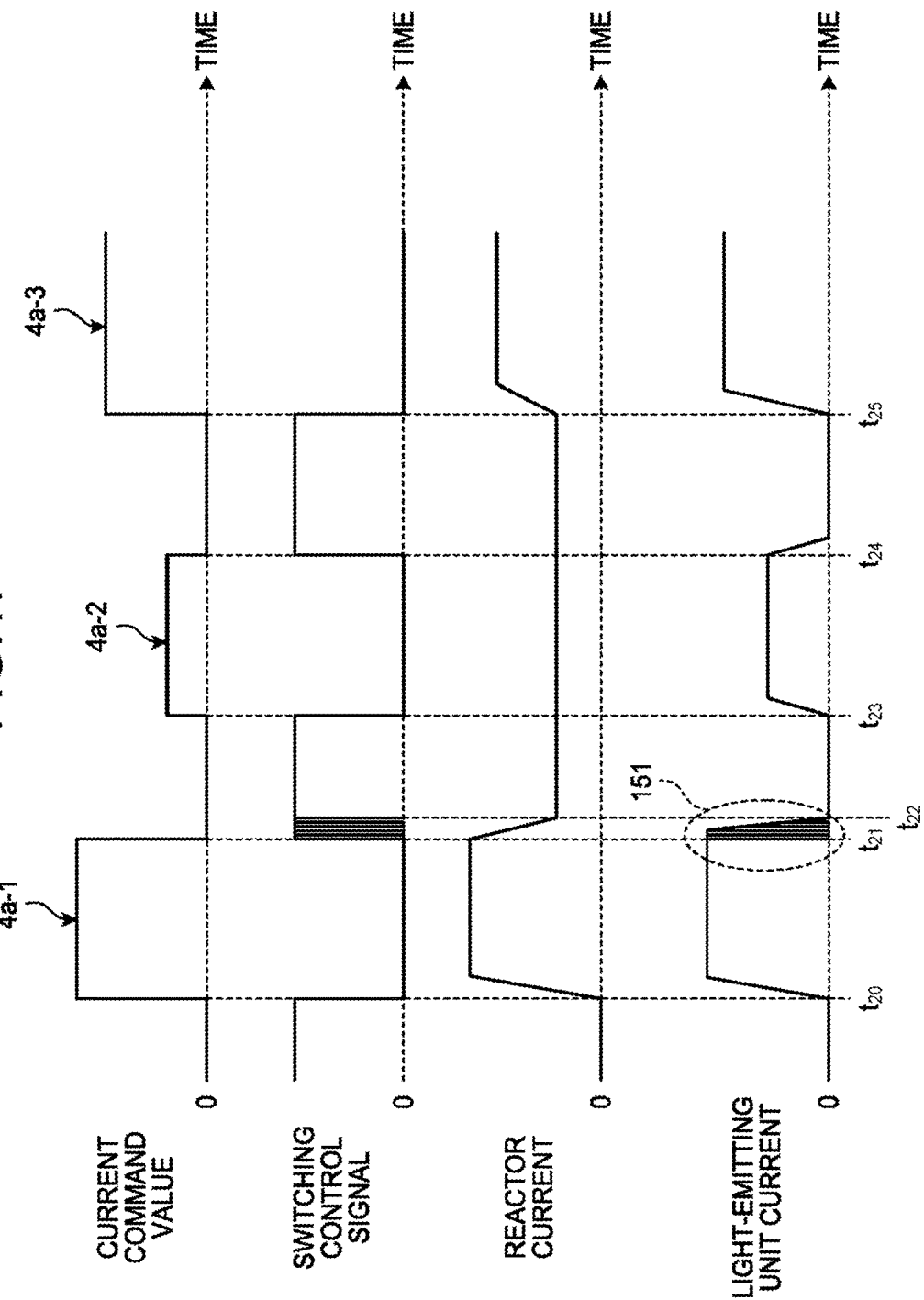
FIG. 17 is a waveform chart for explaining the operation of the current control device according to the fourth embodiment.

FIG. 16 is a flowchart illustrating an operation of the current control device according to the fourth embodiment. FIG. 17 is a waveform chart for explaining the operation of the current control device according to the fourth embodiment. FIG. 17 illustrates a waveform of the current command value 4a, a waveform of the switching control signal 23a, a waveform of the reactor current 45, and a waveform of the light-emitting unit current 24.

The switching control signal generation circuit 53 starts the process illustrated in FIG. 16 at timing $t_{20}$, which is the time to start light emission indicated in the first light emission timing signal.

In addition, at timing $t_{20}$, the power supply device 10 or 140 starts outputting the reactor current 45 based on the first current command value 4a-1.

Referring to FIG. 16, at step S300, the switching control signal generation circuit 53 turns off the switching control signal 23a. This operation causes the switching element 21 to transition to an OFF state and thereby causes the reactor current 45 to flow to the light-emitting unit 3 rather than to the switching element 21.

At step S302, the switching control signal generation circuit 53 waits until timing $t_{21}$ (No), which is the time to terminate light emission indicated in the first light emission timing signal, and at timing $t_{21}$ (Yes), allows the process to proceed to step S304.

Note that, at timing $t_{21}$, the power supply device 10 or 140 provides control such that the reactor current 45 becomes current corresponding to the second current command value 4a-2. However, as described above, the power supply device 10 or 140 has stored electromagnetic energy in the reactor 42c and besides, the power supply device 10 or 140 includes no element to consume the electromagnetic energy stored in the reactor 42c; therefore, when the current command value is changed to the second current command value 4a-2, which is less than the first current command value 4a-1, the reactor current 45 is reduced slowly.

At step S304, the switching control signal generation circuit 53 determines whether the reactor current 45 is greater than the next current command value, i.e., the second current command value 4a-2.

If, at step S304, the switching control signal generation circuit 53 determines that the reactor current 45 is greater than the second current command value 4a-2 (Yes), the process proceeds to step S306.

At step S306, the switching control signal generation circuit 53 calculates the duty cycle of the switching control signal 23a.

The switching control signal generation circuit 53 calculates the duty cycle of the light-emitting unit current 24 using Equation (4) shown below:

(Duty cycle of light-emitting unit current)=(Next current command value/Reactor current)  (4)

Then, the switching control signal generation circuit 53 calculates the duty cycle of the switching control signal 23a using Equation (2) described in the first embodiment.

At step S308, the switching control signal generation circuit 53 performs pulse width modulation on the switching control signal 23a on the basis of the duty cycle calculated using Equation (2) and thus provides pulse width modulation control of the switching element 21.

This operation provides pulse width modulation control of the switching element 21. Thus, the light-emitting unit current 24 having the duty cycle calculated using Equation (4) flows to the light-emitting unit 3, thereby allowing the electromagnetic energy stored in the reactor 42c to be consumed in the light-emitting unit 3. Accordingly, the reactor current 45 decreases by the amount corresponding to the electromagnetic energy consumed in the light-emitting unit 3.

At step S310, the switching control signal generation circuit 53 waits until one period of the carrier signal for the pulse width modulation elapses (No). When one period of the carrier signal for the pulse width modulation has elapsed (Yes), the process proceeds to step S304.

That is, the switching control signal generation circuit 53 repeatedly performs steps S304 to S310 every period of the carrier signal until the reactor current 45 reaches the second current command value 4a-2.

Otherwise, if, at step S304, the switching control signal generation circuit 53 determines that the reactor current 45 is not greater than the next current command value, i.e., the second current command value 4a-2, that is, the reactor current 45 has reached the second current command value 4a-2 (No), the switching control signal generation circuit 53 terminates the pulse width modulation control and allows the process to proceed to step S312.

At step S312, the switching control signal generation circuit 53 turns on the switching control signal 23a and then terminates the process.

Referring to FIG. 17, when the reactor current 45 reaches the second current command value 4a-2 at timing $t_{22}$ after timing $t_{21}$, the switching control signal generation circuit 53 terminates the pulse width modulation control and turns on the switching control signal 23a to provide control to allow the switching element 21 to transition to an ON state.

Figure 18:
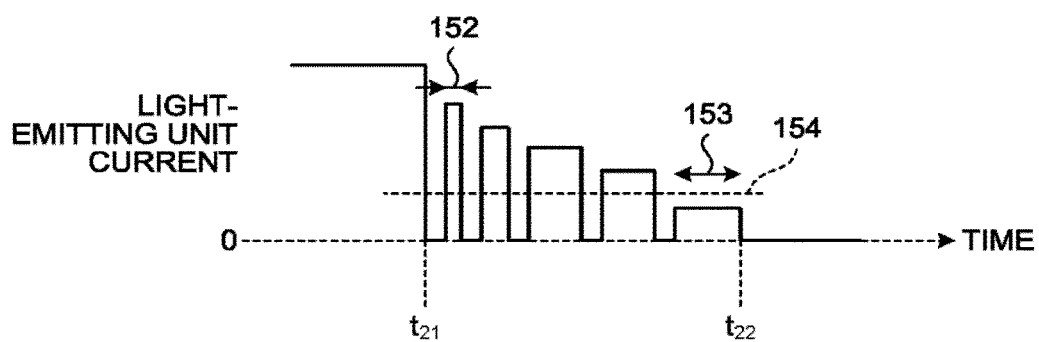
FIG. 18 is a waveform chart for explaining the operation of the current control device according to the fourth embodiment.

FIG. 18 is a waveform chart for explaining the operation of the current control device according to the fourth embodiment. FIG. 18 is an enlarged chart of a section 151 from timing $t_{21}$ to timing $t_{22}$ of the light-emitting unit current 24 of FIG. 17.

Immediately after timing $t_{21}$, the reactor current 45 differs significantly from the second current command value 4a-2. As the electromagnetic energy stored in the reactor 42c is consumed in the light-emitting unit 3 over time, the difference between the value of the reactor current 45 and the second current command value 4a-2 decreases. Thus, as time passes, the duty cycle of the light-emitting unit current 24 increases. That is, the length 153 of the ripple of the light-emitting unit current 24 in the time direction immediately before timing $t_{22}$ is longer than the length 152 of the ripple of the light-emitting unit current 24 in the time direction immediately after timing $t_{21}$. The amplitude of the light-emitting unit current 24, which is the same as the amplitude of the reactor current 45, decreases over time. A broken line 154 indicates the average value of the light-emitting unit current 24 from timing $t_{21}$ to timing $t_{22}$.

At timing $t_{23}$ to start light emission indicated in the second light emission timing signal, the switching control signal generation circuit 53 starts again the process illustrated in FIG. 16.

Referring to FIG. 16, at step S300, the switching control signal generation circuit 53 turns off the switching control signal 23a. This operation causes the switching element 21 to transition to an OFF state and thereby causes the reactor current 45 to flow to the light-emitting unit 3 rather than to the switching element 21.

At step S302, the switching control signal generation circuit 53 waits until timing $t_{24}$ (No), which is the time to terminate light emission indicated in the second light emission timing signal, and at timing $t_{24}$ (Yes), allows the process to proceed to step S304.

At step S304, the switching control signal generation circuit 53 determines whether the reactor current 45 is greater than the next current command value, i.e., the third current command value 4a-3.

If, at step S304, the switching control signal generation circuit 53 determines that the reactor current 45 is not greater than the third current command value 4a-3 (No), the process proceeds to step S312.

At step S312, the switching control signal generation circuit 53 turns on the switching control signal 23a and then terminates the process. This operation causes the switching element 21 to transition to an ON state and thereby causes the reactor current 45 to flow to the switching element 21 rather than to the light-emitting unit 3.

At timing $t_{25}$ to start light emission indicated in the third light emission timing signal, the switching control signal generation circuit 53 starts again the process illustrated in FIG. 16.

In addition, at timing $t_{25}$, the power supply device 10 or 140 starts outputting the reactor current 45 based on the third current command value 4a-3.

Referring to FIG. 16, at step S300, the switching control signal generation circuit 53 turns off the switching control signal 23a. This operation causes the switching element 21 to transition to an OFF state and thereby causes the reactor current 45 to flow to the light-emitting unit 3 rather than to the switching element 21.

The subsequent operations of the switching control signal generation circuit 53 are similar to those described above, and thus, the description thereof will be omitted.

As described above, the current control device 20 according to the fourth embodiment provides pulse width modulation control of the switching element 21 to provide pulse width modulation control of the light-emitting unit 3 until the reactor current 45 reaches the next current command value 4a if the reactor current 45 is greater than the next current command value 4a upon the termination of supply of the light-emitting unit current 24, thereby allowing the electromagnetic energy stored in the reactor 42c to be consumed in the light-emitting unit 3.

Thus, even when the power supply device 10 or 140 reduces the reactor current 45 slowly, the current control device 20 can suitably control the light-emitting unit current 24 and thus cause the light-emitting unit 3 to suitably emit light. Accordingly, the current control device 20 enables suitable machining of a workpiece to be provided.

In addition, the current control device 20 allows the light-emitting unit 3 to consume the electromagnetic energy stored in the reactor 42c. This eliminates the need for the current control device 20 to further include an element to consume the electromagnetic energy stored in the reactor 42c.

Accordingly, the current control device 20 can reduce the number of components, reduce the footprint, and reduce the cost.

Fifth Embodiment

The configuration of a laser-diode power supply apparatus that includes a current control device according to a fifth embodiment is similar to the configuration of the laser-diode power supply apparatus 1 according to the first embodiment illustrated in FIG. 1 or to the configuration of the laser-diode power supply apparatus 130 according to the second embodiment illustrated in FIG. 12, and thus, the illustration and the description thereof will be omitted.

FIG. 19 is a flowchart illustrating an operation of the current control device according to the fifth embodiment. FIG. 20 is a waveform chart for explaining the operation of the current control device according to the fifth embodiment. FIG. 20 illustrates a waveform of the current command value 4a, a waveform of the switching control signal 23a, a waveform of the reactor current 45, and a waveform of the light-emitting unit current 24.

In the fifth embodiment, the power supply device 10 or 140 keeps outputting the reactor current 45 at a constant level irrespective of a light emission start timing and a light emission end timing of the light-emitting unit 3. An example of the reactor current 45 at a constant level is the rated current of the light-emitting unit 3.

The switching control signal generation circuit 53 starts the process illustrated in FIG. 19 at timing $t_{30}$, which is the time to start light emission indicated in the first light emission timing signal.

At step S400, the switching control signal generation circuit 53 determines whether the reactor current 45 is greater than the present current command value, i.e., the first current command value 4a-1.

The fifth embodiment assumes that the first current command value 4a-1 is the rated current value.

At step S400, the switching control signal generation circuit 53 determines that the reactor current 45 is not greater than the first current command value 4a-1 (No) and allows the process to proceed to step S402.

At step S402, the switching control signal generation circuit 53 turns off the switching control signal 23a. This operation causes the switching element 21 to transition to an OFF state and thereby causes the reactor current 45 to flow to the light-emitting unit 3 rather than to the switching element 21.

At step S404, the switching control signal generation circuit 53 waits until timing $t_{31}$ (No), which is the time to terminate light emission indicated in the first light emission timing signal, and at timing $t_{31}$ (Yes), allows the process to proceed to step S406.

At step S406, the switching control signal generation circuit 53 turns on the switching control signal 23a and then terminates the process. This operation causes the switching element 21 to transition to an ON state and thereby causes the reactor current 45 to flow to the switching element 21 rather than to the light-emitting unit 3.

At timing $t_{32}$ to start light emission indicated in the second light emission timing signal, the switching control signal generation circuit 53 starts again the process illustrated in FIG. 19.

Referring to FIG. 19, at step S400, the switching control signal generation circuit 53 determines whether the reactor current 45 is greater than the present current command value, i.e., the second current command value 4a-2.

At step S400, the switching control signal generation circuit 53 determines that the reactor current 45 is greater than the second current command value 4a-2 (Yes) and allows the process to proceed to step S408.

At step S408, the switching control signal generation circuit 53 calculates the duty cycle of the light-emitting unit current 24 using Equation (1) described in the first embodiment. Moreover, the switching control signal generation circuit 53 calculates the duty cycle of the switching control signal 23a using Equation (2) described in the first embodiment.

At step S410, the switching control signal generation circuit 53 performs pulse width modulation on the switching control signal 23a on the basis of the duty cycle calculated using Equation (2) and thus provides pulse width modulation control of the switching element 21.

This operation provides pulse width modulation control of the switching element 21. Thus, the light-emitting unit current 24 having the duty cycle calculated using Equation (1) flows to the light-emitting unit 3. Note that the power supply device 10 or 140 keeps outputting the reactor current 45 at a constant level, and thus the magnitude of the reactor current 45 does not change.

At step S404, the switching control signal generation circuit 53 waits until timing $t_{33}$, which is the time to terminate light emission indicated in the second light emission timing signal (No), and at timing $t_{33}$ (Yes), allows the process to proceed to step S406.

At step S406, the switching control signal generation circuit 53 turns on the switching control signal 23a and then terminates the process. This operation causes the switching element 21 to transition to an ON state and thereby causes the reactor current 45 to flow to the switching element 21 rather than to the light-emitting unit 3.

At timing $t_{34}$ to start light emission indicated in the third light emission timing signal, the switching control signal generation circuit 53 starts again the process illustrated in FIG. 19.

Referring to FIG. 19, at step S400, the switching control signal generation circuit 53 determines whether the reactor current 45 is greater than the present current command value, i.e., the third current command value 4a-3.

At step S400, the switching control signal generation circuit 53 determines that the reactor current 45 is greater than the third current command value 4a-3 (Yes) and allows the process to proceed to step S408.

At step S408, the switching control signal generation circuit 53 calculates the duty cycle of the light-emitting unit current 24 using Equation (1) described in the first embodiment. Moreover, the switching control signal generation circuit 53 calculates the duty cycle of the switching control signal 23a using Equation (2) described in the first embodiment.

At step S410, the switching control signal generation circuit 53 performs pulse width modulation on the switching control signal 23a on the basis of the duty cycle calculated using Equation (2) and thus provides pulse width modulation control of the switching element 21.

This operation provides pulse width modulation control of the switching element 21. Thus, the light-emitting unit current 24 having the duty cycle calculated using Equation (1) flows to the light-emitting unit 3. Note that the power supply device 10 or 140 keeps outputting the reactor current 45 at a constant level, and thus the magnitude of the reactor current 45 does not change.

The subsequent operations of the switching control signal generation circuit 53 are similar to those described above, and thus, the description thereof will be omitted.

As described above, the current control device 20 according to the fifth embodiment provides pulse width modulation control of the switching element 21 to perform pulse width modulation on the light-emitting unit current 24 during supply of the light-emitting unit current 24 if the reactor current 45 is greater than the present current command value 4a, thereby allowing the light-emitting unit 3 to emit light.

Accordingly, the current control device 20 eliminates the need for the power supply device 10 or 140 to change the magnitude of the reactor current 45. Thus, even when the power supply device 10 or 140 reduces the reactor current 45 slowly, the current control device 20 can suitably control the light-emitting unit current 24 and thus cause the light-emitting unit 3 to suitably emit light. Accordingly, the current control device 20 enables suitable machining of a workpiece to be provided.

The configurations described in the foregoing embodiments are merely examples of various aspects the present invention. These configurations may be combined with a different known technology, and moreover, part of such configurations may be omitted and/or modified without departing from the spirit of the present invention.

REFERENCE SIGNS LIST

1, 130 laser-diode power supply apparatus; 3 light-emitting unit; 3a laser diode; 10, 140 power supply device; 20 current control device; 21 switching element; 22 snubber circuit; 22a diode; 22b resistor; 22c capacitor; 23 PWM control circuit unit; 30 constant-voltage output unit; 40 current output unit; 51 look-up table; 52 machining condition read circuit; 53 switching control signal generation circuit.

The invention claimed is:

1. A current control device for controlling, on a basis of a current command value input from an external device, a light-emitter current flowing from a power supply device to a light emitter that includes one or a plurality of laser diodes, the current control device comprising:
a switching element coupled in parallel to the light emitter; and
a pulse-width-modulation control circuit to provide pulse width modulation control of the switching element in a case in which an output current output from the power supply device is greater than a present current command value or a next current command value upon a start of supply of, upon a termination of supply of, or during supply of, the light-emitter current, wherein
the power supply device outputs the output current corresponding to the current command value, and
the pulse-width-modulation control circuit provides pulse width modulation control of the switching element until the output current becomes the present current command value in a case in which the output current is greater than the present current command value upon the start of supply of the light-emitter current.

2. A current control device for controlling, on a basis of a current command value input from an external device, a light-emitter current flowing from a power supply device to a light emitter that includes one or a plurality of laser diodes, the current control device comprising:
a switching element coupled in parallel to the light emitter; and
a pulse-width-modulation control circuit to provide pulse width modulation control of the switching element in a case in which an output current output from the power supply device is greater than a present current command value or a next current command value upon a start of supply of, upon a termination of supply of, or during supply of, the light-emitter current, wherein
the power supply device outputs the output current corresponding to the current command value, and
the pulse-width-modulation control circuit provides pulse width modulation control of the switching element until the output current becomes the next current command value in a case in which the output current is greater than the next current command value upon the termination of supply of the light-emitter current.

3. A current control device for controlling, on a basis of a current command value input from an external device, a light-emitter current flowing from a power supply device to a light emitter that includes one or a plurality of laser diodes, the current control device comprising:
a switching element coupled in parallel to the light emitter; and
a pulse-width-modulation control circuit to provide pulse width modulation control of the switching element in a case in which an output current output from the power supply device is greater than a present current command value or a next current command value upon a start of supply of, upon a termination of supply of, or during supply of, the light-emitter current, wherein
the power supply device outputs the output current corresponding to the current command value, and
the pulse-width-modulation control circuit provides pulse width modulation control of the switching element until the output current becomes 0 in a case in which the output current is greater than the next current command value upon the termination of supply of the light-emitter current.

4. The current control device according to claim 1, wherein the switching element is disposed in a single module together with the light emitter.

5. The current control device according to claim 2, wherein the switching element is disposed in a single module together with the light emitter.

6. The current control device according to claim 3, wherein the switching element is disposed in a single module together with the light emitter.

\* \* \* \* \*